United States Patent
Song et al.

(10) Patent No.: US 12,223,905 B2
(45) Date of Patent: Feb. 11, 2025

(54) DISPLAY PANEL AND DISPLAY APPARATUS

(71) Applicant: SAMSUNG ELECTRONICS CO., LTD., Suwon-si (KR)

(72) Inventors: Uijong Song, Suwon-si (KR); Sunkwon Kim, Suwon-si (KR); Hyungjoong Kim, Suwon-si (KR); Seongyoung Ryu, Suwon-si (KR); Yilho Lee, Suwon-si (KR); Heejin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/590,365

(22) Filed: Feb. 28, 2024

(65) Prior Publication Data

US 2024/0321206 A1    Sep. 26, 2024

(30) Foreign Application Priority Data

Mar. 24, 2023  (KR) ................ 10-2023-0039188
May 19, 2023  (KR) ................ 10-2023-0064985
May 19, 2023  (KR) ................ 10-2023-0064986

(51) Int. Cl.
*G09G 3/3233*  (2016.01)
*G09G 3/3266*  (2016.01)
*G09G 3/3275*  (2016.01)
*H10K 59/131*  (2023.01)

(52) U.S. Cl.
CPC ......... *G09G 3/3233* (2013.01); *G09G 3/3266* (2013.01); *G09G 3/3275* (2013.01); *H10K 59/131* (2023.02); *G09G 2300/0814* (2013.01); *G09G 2300/0819* (2013.01); *G09G 2300/0842* (2013.01); *G09G 2300/0861* (2013.01); *G09G 2310/0278* (2013.01); *G09G 2310/08* (2013.01);

(Continued)

(58) Field of Classification Search
None
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |

(Continued)

FOREIGN PATENT DOCUMENTS

CN    113808532 A    12/2021

*Primary Examiner* — Stephen T. Reed
(74) *Attorney, Agent, or Firm* — Sughrue Mion, PLLC

(57) ABSTRACT

A display apparatus includes plural pixels, a scan driver, a data driver, and a read-out circuit that reads out an electrical characteristic of each of the pixels. Each of the pixels includes a first transistor, a second transistor, a third transistor, a fourth transistor including a first electrode connected with a power node, a second electrode connected with a first node, and a gate connected with a first emission control line, a fifth transistor including a first electrode connected with a third node, a second electrode, and a gate connected with a second emission control line, a sixth transistor including a first electrode connected with a read-out line, a second electrode connected with the third node, and a gate connected a the read-out/initialization control line, a capacitor connected between the first node and the second node, and an organic light-emitting diode.

20 Claims, 31 Drawing Sheets

(52) U.S. Cl.
CPC ............... *G09G 2320/0626* (2013.01); *G09G 2330/021* (2013.01)

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,558,768 B2 | 10/2013 | Tanikame |
| 8,735,931 B2 | 5/2014 | Han et al. |
| 8,766,295 B2 | 7/2014 | Kim |
| 10,381,426 B2 * | 8/2019 | Ka ..................... H10K 59/1213 |
| 11,410,605 B2 | 8/2022 | Hong et al. |
| 11,462,163 B2 | 10/2022 | Lin et al. |
| 11,508,309 B2 | 11/2022 | Lin et al. |
| 2023/0013661 A1 | 1/2023 | Beard et al. |
| 2024/0021152 A1 * | 1/2024 | Wang ................... G09G 3/3225 |

\* cited by examiner

DISPLAY PANEL AND DISPLAY APPARATUS

CROSS-REFERENCE TO RELATED APPLICATIONS

This application is based on and claims priority under 35 U.S.C. § 119 to Korean Patent Application No. 10-2023-0039188, filed Mar. 24, 2023, Korean Patent Application No. 10-2023-0064985, filed on May 19, 2023, and Korean Patent Application No. 10-2023-0064986, filed May 19, 2023 in the Korean Intellectual Property Office, the disclosure of each of which being incorporated by reference herein in their entireties.

BACKGROUND

The present disclosure relates to a semiconductor device, and more particularly, to a display panel and a display apparatus.

Display apparatuses may receive image data from the outside and may apply an image signal, corresponding to the received image data, to a display panel to drive the display panel. Recently, the use of an organic light-emitting diode (OLED) display panel where each of a plurality of pixels of a pixel array includes an OLED has been increasing.

As display apparatuses are progressively miniaturized, or as the resolution of display apparatuses increases, sizes of pixels are progressively reduced. When sizes of pixels are reduced, a range of the amount of current flowing through each pixel may be limited. When a range of the amount of current flowing through each pixel is limited, it may be difficult to control the brightness of pixels.

SUMMARY

It is an aspect to provide a display panel and a display apparatus including the same, which may easily adjust the brightness of pixels.

According to an aspect of one or more embodiments, there is provided a display apparatus comprising a plurality of pixels arranged in rows and columns; a scan driver connected with the rows of pixels through a scan line, a first emission control line, a second emission control line, and a read-out/initialization control line; a data driver connected with the columns of pixels through a data line; and a read-out circuit connected with the columns of pixels through a read-out line and configured to read out an electrical characteristic of each of the plurality of pixels. Each of the plurality of pixels comprises a first transistor including a first electrode connected with a first node, a second electrode connected with a third node, and a gate connected with a second node; a second transistor including a first electrode connected with the data line, a second electrode connected with the first node, and a gate connected with the scan line; a third transistor including a first electrode connected with the second node, a second electrode connected with the third node, and a gate connected with the scan line; a fourth transistor including a first electrode connected with a power node to which a source voltage is supplied, a second electrode connected with the first node, and a gate connected with the first emission control line; a fifth transistor including a first electrode, a second electrode, and a gate, the first electrode of the fifth transistor being connected with the third node and the gate of the fifth transistor being connected with the second emission control line; a sixth transistor including a first electrode connected with the read-out line, a second electrode connected with the third node, and a gate connected with the read-out/initialization control line; a capacitor connected between the first node and the second node; and an organic light-emitting diode connected between the second electrode of the fifth transistor and a ground node to which a ground voltage is supplied.

According to another aspect of one or more embodiments, there is provided a display apparatus comprising a display panel including a plurality of pixels; and a display driving circuit including a scan driver, a data driver, and a read-out circuit. Each of the plurality of pixels comprises a first transistor connected between a first node and a third node and configured to operate based on a voltage of a second node; a second transistor connected between the first node and a data line and configured to operate based on a scan signal received through a scan line; a third transistor connected between the second node and the third node and configured to operate based on the scan signal; a fourth transistor connected between a first driving power source and the first node and configured to operate based on a first emission control signal received through a first emission control line; a fifth transistor connected between the third node and an organic light-emitting diode and configured to operate based on a second emission control signal received through a second emission control line; a sixth transistor connected between a read-out line and the second node and configured to operate based on a read-out/initialization control signal received through a read-out/initialization control line; a capacitor connected between the first node and the second node; and the organic light-emitting diode connected between the fifth transistor and a second driving power source. The scan driver is connected with the plurality of pixels through the scan line, the first emission control line, the second emission control line, and the read-out/initialization control line, the data driver is connected with the plurality of pixels through the data line and is configured to supply a data voltage corresponding to a luminance through the data line, and the read-out circuit is connected with the plurality of pixels through the read-out line and is configured to read out an electrical characteristic of each of the plurality of pixels through the read-out line.

According to another aspect of one or more embodiments, there is provided a display panel including a plurality of pixels, each of the plurality of pixels comprising a scan line extending in a first direction; a first emission control line extending in the first direction; a second emission control line extending in the first direction; a read-out/initialization control line extending in the first direction; a data line extending in a second direction intersecting with the first direction; a read-out line extending in the second direction; a first transistor connected between a first node and a third node and configured to operate based on a voltage of a second node; a second transistor connected between the first node and the data line and configured to operate based on a scan signal received through the scan line; a third transistor connected between the second node and the third node and configured to operate based on the scan signal; a fourth transistor connected between a first driving power source and the first node and configured to operate based on a first emission control signal received through the first emission control line; a fifth transistor connected between the third node and an organic light-emitting diode and configured to operate based on a second emission control signal received through the second emission control line; a sixth transistor connected between the read-out line and the third node and configured to operate based on a read-out/initialization control signal received through the read-out/initialization control line; a capacitor connected between the first node and the second node; and the organic light-emitting diode connected between the fifth transistor and a second driving power source.

BRIEF DESCRIPTION OF THE DRAWINGS

Various embodiments will be more clearly understood from the following detailed description taken in conjunction with the accompanying drawings, in which.

DETAILED DESCRIPTION

Display apparatuses include a display panel which displays an image and a display driving circuit which drives the display panel. The display driving circuit may receive image data from the outside and may apply an image signal, corresponding to the received image data, to a data line of the display panel to drive the display panel.

Display apparatuses may include a plurality of pixels. The plurality of pixels may be arranged in rows and columns. Rows each including a plurality of pixels may be connected with a scan driver, and columns each including a plurality of pixels may be connected with a data driver. The scan driver may control a timing for selecting each row including a plurality of pixels. The data driver may adjust the brightness of pixels of a selected row. As described above, as display apparatuses are progressively miniaturized, or as the resolution of display apparatuses increases, sizes of pixels are progressively reduced. When sizes of pixels are reduced, a range of the amount of current flowing through each pixel may be limited. When a range of the amount of current flowing through each pixel is limited, it may be difficult to control the brightness of pixels.

Hereinafter, various embodiments will be described in detail with reference to the accompanying drawings.

Figure 1:
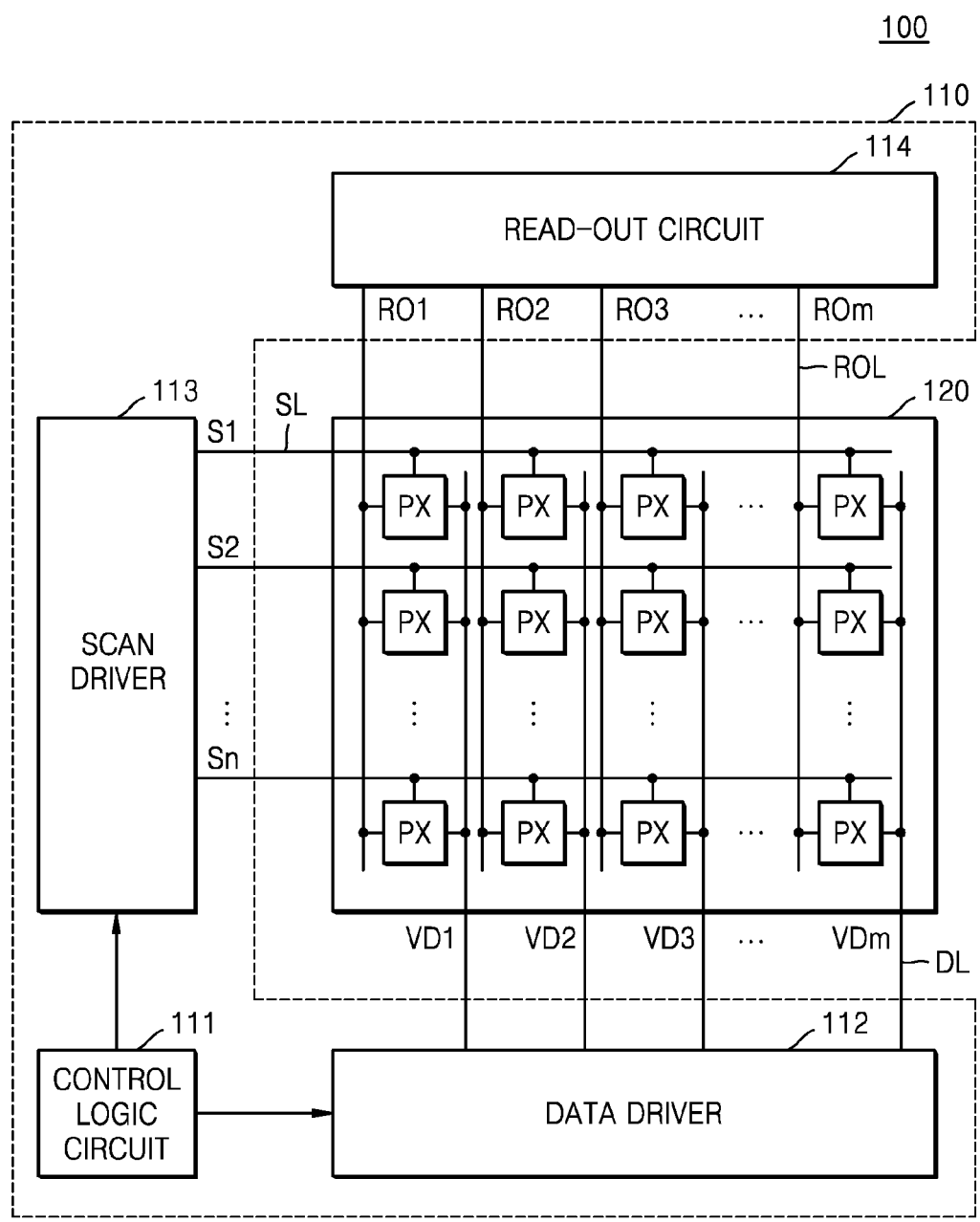
FIG. 1 is a block diagram illustrating a display apparatus according to an embodiment.

FIG. 1 is a block diagram illustrating a display apparatus 100 according to an embodiment.

Referring to FIG. 1, the display apparatus 100 may include a display driving circuit 110 (also referred to as a display driving integrated circuit) and a display panel 120.

In an embodiment, the display apparatus 100 may be equipped in an electronic device having an image display function. For example, the electronic device may include a smartphone, a tablet personal computer (PC), a portable multimedia player (PMP), a camera, a wearable device, a television (TV), a digital video disk (DVD) player, a refrigerator, an air conditioner, an air cleaner, a set-top box, a robot, a drone, various medical devices, a navigation device, an augmented reality (AR) device, a virtual reality (VR) device, a global positioning system (GPS) receiver, an advanced driver assistance system (ADAS), an automotive device, furniture, or various meters.

In an embodiment, the electronic device may include AR glasses which are worn on a facial part of a user, a head mounted display (HMD) device which is worn on a head part, a virtual reality headset (VRH), or an AR helmet.

The display apparatus 100 may display an image corresponding to image data received from a host (not shown). In an embodiment, the display apparatus 100 may be an apparatus where the display driving circuit 110 and the display panel 120 are implemented as one module. For example, the display driving circuit 110 may be mounted on a substrate of the display panel 120, or the display driving circuit 110 may be electrically connected with the display panel 120 by a connection member such as a flexible printed circuit board (FPCB).

In an embodiments, the display panel 120 may be a display unit which displays a real image and may be a display apparatus, which receives an image signal electrically transferred thereto to display a two-dimensional (2D) image. In an embodiment, the display apparatus may be an organic light-emitting diode (OLED) display, a thin film transistor-liquid crystal display (TFT-LCD), a field emission display, and/or a plasma display panel (PDP). Hereinafter, in an embodiment, it may be assumed that the display panel 120 is an OLED display panel where each pixel includes an OLED. However, embodiments are not limited thereto, and in some embodiments, the display panel 120 may be implemented as other kinds of flat panel displays or flexible display panels.

The display panel 120 may be connected with a scan driver 113 through first conductive lines, second conductive line, third conductive lines, and a fourth conductive lines. For example, a plurality of first conductive lines may include a plurality of scan lines SL. A plurality of second conductive lines may include a plurality of first emission control lines. A plurality of third conductive lines may include a plurality of second emission control lines. A plurality of fourth conductive lines may include a plurality of read-out/initialization control lines.

The display panel 120 may be connected with a data driver 112 through a plurality of fifth conductive lines. The plurality of fifth conductive lines may include a plurality of data lines DL. The display panel 120 may be connected with a read-out circuit 114 through a plurality of sixth conductive lines. The plurality of sixth conductive lines may include a plurality of read-out lines ROL.

The display driving circuit 110 may receive image data from the host. The display driving circuit 110 may convert the image data into a plurality of analog signals (for example, a plurality of data voltages) for driving the display panel 120. The display driving circuit 110 may supply the converted plurality of analog signals to the display panel 120. Therefore, the display panel 120 may display an image corresponding to the image data.

The display driving circuit 110 may include a control logic circuit 111, the data driver 112 (also referred to as a source driver), the scan driver 113 (also referred to as a gate driver), and a read-out circuit 114. The display driving circuit 110 may further include other elements (for example, an interface circuit, a memory, a voltage generator, and a clock generator, etc.).

In an embodiment, the control logic circuit 111, the data driver 112, the scan driver 113, and the read-out circuit 114 may be integrated into one semiconductor chip. In some embodiments, the control logic circuit 111, the data driver 112, and the read-out circuit 114 may be integrated into one semiconductor chip, and the scan driver 113 may be provided in the display panel 120.

The control logic circuit 111 may control the overall operation of the display driving circuit 110 and may control the elements (for example, the data driver 112, the scan driver 113, and the read-out circuit 114) of the display driving circuit 110 so that an image corresponding to the image data received from the host is displayed on the display panel 120.

The control logic circuit 111 may perform image processing for a luminance change, a size change, and a format change on the received image data, or may generate new image data which is to be displayed on the display panel 120, based on the received image data. To this end, the control logic circuit 111 may include intellectual properties (IPs) for image processing.

The control logic circuit 111 may provide a data driver control signal to the data driver 112. The control logic circuit 111 may control the data driver 112 by using the data driver control signal. The control logic circuit 111 may provide a scan driver control signal to the scan driver 113. The control logic circuit 111 may control the scan driver 113 by using the scan driver control signal. In some embodiments, the control logic circuit 111 may control operation timings of the scan driver 113 by using a timing signal.

The data driver 112 may be connected with columns including pixels PX through a plurality of data lines DL. The data driver 112 may receive the image data from the control logic circuit 111. The image data may include information about the brightness of pixels of one row. The data driver 112 may convert the received image data into a plurality of image signals (for example, a plurality of data voltages VD1 to VDm). The data driver 112 may output the plurality of data voltages VD1 to VDm to the display panel 120 through the plurality of data lines DL.

The data driver 112 may receive image data by line data units, namely, by data units corresponding to a plurality of pixels included in one horizontal line of the display panel 120. The data driver 112 may convert line data, received from the control logic circuit 111, into the plurality of data voltages VD1 to VDm (where m may be an integer of 2 or more). The data driver 112 may provide the plurality of data voltages VD1 to VDm, corresponding to luminance, to the display panel 120 through the plurality of data lines DL.

The scan driver 113 may be connected with a plurality of control lines. In an embodiment, the scan driver 113 may be connected with rows including the pixels PX through the plurality of control lines. The plurality of control lines may include a plurality of scan lines SL, a plurality of first emission control lines, a plurality of second emission control lines, and a plurality of read-out/initialization control lines.

The scan driver 113 may receive a scan driver control signal from the control logic circuit 111. The scan driver 113 may output a plurality of control signals to the display panel 120 through the plurality of control lines in response to the scan driver control signal received from the control logic circuit 111. For example, the scan driver 113 may be connected with the plurality of scan lines SL of the display panel 120 and may sequentially drive (or select) the plurality of scan lines SL of the display panel 120.

The scan driver 113 may sequentially provide the plurality of scan lines SL with scan signals S1 to Sn (where n may be a positive integer of 2 or more) having an active level (for example, logic low), based on control by the control logic circuit 111. Therefore, the plurality of scan lines SL may be sequentially selected, and the plurality of data voltages VD1 to VDm may be applied to a plurality of pixels PX connected with a selected scan line SL.

In an embodiment, the scan driver 113 may supply the plurality of control signals to a pixel PX. The plurality of control signals may include a scan signal, a first emission control signal, a second emission control signal, and a read-out/initialization control signal. For example, the scan driver 113 may provide the scan signal to the pixel PX through the scan line. The scan driver 113 may supply the first emission control signal to the pixel PX through the first emission control line. The scan driver 113 may supply the second emission control signal to the pixel PX through the second emission control line. The scan driver 113 may supply the read-out/initialization control signal to the pixel PX through the read-out/initialization control line.

The read-out circuit 114 may be connected with columns including pixels PX through a plurality of read-out lines ROL. For example, the read-out circuit 114 may be connected with the plurality of read-out lines ROL. The read-out circuit 114 may receive a plurality of read-out signals RO1 to ROm from the display panel 120 through the plurality of read-out lines ROL. In an embodiment, the read-out circuit 114 may include an amplifier, a sample/hold circuit, and an analog-to-digital converter.

In an embodiment, the read-out circuit 114 may read out (or sense) an electrical characteristic of each of a plurality of pixels PX. The read-out circuit 114 may receive the plurality of read-out signals RO1 to ROm through the plurality of read-out lines ROL. The plurality of read-out signals RO1 to ROm may represent an electrical characteristic of a pixel connected with the plurality of read-out lines ROL. The read-out circuit 114 may receive the plurality of read-out signals RO1 to ROm corresponding to a selected pixel and may analog-to-digital convert the plurality of read-out signals RO1 to ROm to generate read-out data. The read-out circuit 114 may provide the generated read-out data to the control logic circuit 111.

For example, the read-out circuit 114 may detect a driving current of each of the plurality of pixels PX. The read-out circuit 114 may detect a threshold voltage of each of the plurality of pixels PX. The read-out circuit 114 may detect a forward voltage of each of the plurality of pixels PX.

The read-out circuit 114 may measure a level of the driving current of each of the plurality of pixels PX. The read-out circuit 114 may measure a level of the threshold voltage of each of the plurality of pixels PX. The read-out circuit 114 may measure a level of the forward voltage of each of the plurality of pixels PX.

The display panel 120 may include the plurality of pixels PX which are arranged in rows and columns. The display panel 120 may include the plurality of data lines DL, the plurality of scan lines SL, and the plurality of pixels PX provided between the plurality of data lines DL and the plurality of scan lines SL. Each of the plurality of pixels PX may be connected with a scan line SL and a data line DL each corresponding thereto.

The rows including the pixels PX may be connected with the plurality of control lines. Each of the plurality of pixels PX may be connected with a scan line, a first emission control line, a second emission control line, and a read-out/initialization control line. Each of the plurality of pixels PX may receive a plurality of control signals (for example, first to fourth control signals) from the scan driver 113 through the plurality of control lines. For example, the first control signal may include the scan signal, the second control signal may include the first emission control signal, the third control signal may include the second emission control signal, and the fourth control signal may include the read-out/initialization control signal.

Each of the plurality of pixels PX may receive the scan signal through the scan line SL, and each of the plurality of pixels PX may receive the first emission control signal through the first emission control line, receive the second emission control signal through the second emission control line, and receive the read-out/initialization control signal through the read-out/initialization control line.

In an embodiment, the display panel 120 may be connected with the plurality of read-out lines ROL. The display panel 120 may supply the plurality of read-out signals RO1 to ROm to the read-out circuit 114 through the plurality of read-out lines ROL.

Each of the pixels PX may control brightness in response to corresponding control signals. For example, each of the pixels PX may be selected in response to a corresponding scan signal of a plurality of scan signals S1 to Sn. Each of the selected pixels PX may emit light based on a corresponding data voltage of a plurality of data voltages VD1 to VDm. Each of the pixels PX may include a light-emitting device such as an OLED and transistors which control the light-emitting device.

Each of the plurality of pixels PX may emit light of a predetermined color, and two or more pixels PX (for example, red, blue, and green pixels) which are disposed adjacent to one another in the same or adjacent line and emit pieces of light of different colors may configure one unit pixel. In this case, two or more pixels PX configuring a unit pixel may be referred to as subpixels. The display panel 120 may have an RGB structure where red, blue, and green pixels configure one unit pixel. However, embodiments are not limited thereto, and in some embodiments, the display panel 120 may have an RGBW structure where a unit pixel further includes a white pixel for luminance enhancement. In some embodiments, a unit pixel of the display panel 120 may be configured by a combination of pixels of a color other than red, green, and blue.

The display panel 120 may be an OLED display panel where each of the plurality of pixels PX includes an OLED. However, embodiments are not limited thereto, and in some embodiments, the display panel 120 may be implemented as a different kind of flat panel display or flexible display panel.

Figure 2:
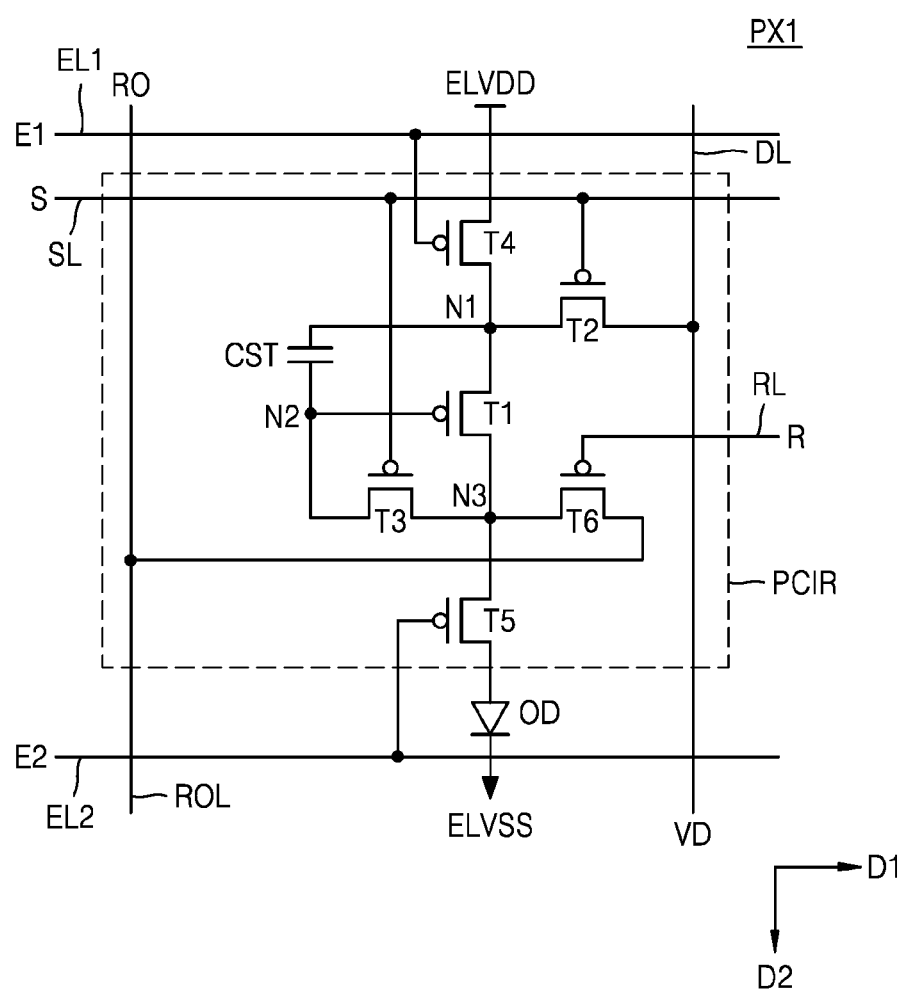
FIG. 2 is a circuit diagram illustrating an example of a pixel according to an embodiment.

FIG. 2 is a circuit diagram illustrating an example of a pixel PX1 according to an embodiment. The pixel PX1 of FIG. 2 may be applied to the display apparatus of FIG. 1. The pixel PX of FIG. 1 may include the pixel PX1 of FIG. 2.

Referring to FIGS. 1 and 2, the pixel PX1 may include an OLED OD and a pixel circuit PCIR. The pixel PX1 may include a scan line SL extending in a first direction D1, a first emission control line EL1 extending in the first direction D1, a second emission control line EL2 extending in the first direction D1, a read-out/initialization control line RL extending in the first direction D1, a data line DL extending in a second direction D2 intersecting with the first direction D1, a read-out line ROL extending in the second direction D2, a first transistor T1, a second transistor T2, a third transistor T3, a fourth transistor T4, a fifth transistor T5, and a sixth transistor T6, a storage capacitor CST, and the OLED OD. For example, the first direction D1 may be an X-axis direction and the second direction D2 may be a Y-axis direction.

An anode electrode of the OLED OD may be connected with the pixel circuit PCIR, and a cathode electrode thereof may be connected with a second driving power source ELVSS. In some embodiments, the second driving power source ELVSS may be referred to as a ground node and may be supplied with a ground voltage. The OLED OD may emit light having luminance corresponding to the amount of current supplied from the pixel circuit PCIR. The brightness of the OLED OD may be controlled by a voltage (i.e., a data voltage VD) of the data line DL.

The pixel circuit PCIR may control the amount of current flowing to the second driving power source ELVSS via the OLED OD from a first driving power source ELVDD, based on the data voltage VD. The pixel circuit PCIR may include the first to sixth transistors T1 to T6 and the storage capacitor CST. At least one of the first to sixth transistors T1 to T6 may be implemented with a metal oxide semiconductor field effect transistor (MOSFET) or a low temperature polysilicon (LTPS) thin film transistor including an active layer including an oxide semiconductor thin film transistor polysilicon including an active layer including an oxide semiconductor. In an embodiment, at least one of the first to sixth transistors T1 to T6 may be implemented as a P-type transistor. However, embodiments are not limited thereto, and in some embodiments, at least one of the first to sixth transistors T1 to T6 may be implemented as an N-type transistor.

The first transistor T1 (or a driving transistor) may be connected between a first node N1 and a third node N3 and may operate in response to a voltage of the second node N2. A first electrode (or a first terminal) of the first transistor T1 may be connected with the first node N1, and a second electrode (or a second terminal) of the first transistor T1 may be connected with the third node N3. A gate electrode (or a gate) of the first transistor T1 may be connected with the second node N2. The first transistor T1 may control the amount of current flowing to the second driving power source ELVSS via the OLED OD from the first driving power source ELVDD, based on a voltage of the second node N2.

The second transistor T2 (or a selection transistor) may be connected between the data line DL and the first node N1 and may operate in response to the scan signal S. A first electrode (or a first terminal) of the second transistor T2 may be connected with the data line DL, and a second electrode (or a second terminal) of the second transistor T2 may be connected with the first node N1. A gate electrode (or a gate) of the second transistor T2 may be connected with the scan line SL. In response to the scan signal S having an active level supplied through the scan line SL, the second transistor T2 may be turned on. The second transistor T2 may be turned on and may electrically connect the first node N1 and the data line DL.

The third transistor T3 may be connected between the second node N2 and the third node N3 and may operate in response to the scan signal S. A first electrode (or a first terminal) of the third transistor T3 may be connected with the second node N2, and a second electrode (or a second terminal) of the third transistor T3 may be connected with the third node N3. A gate electrode (or a gate) of the third transistor T3 may be connected with the scan line SL. In response to the scan signal S having an active level supplied through the scan line SL, the third transistor T3 may be turned on. The third transistor T3 may be turned on and may electrically connect the second node N2 and the third node N3. That is, the third transistor T3 may provide a diode connection of the first transistor T1.

The fourth transistor T4 may be connected between the first driving power source ELVDD and the first node N1 and may operate in response to a first emission control signal E1. A first electrode (or a first terminal) of the fourth transistor T4 may be connected with the first driving power source ELVDD (or a power node supplied with a source voltage), and a second electrode (or a second terminal) of the fourth transistor T4 may be connected with the first node N1. A gate electrode (or a gate) of the fourth transistor T4 may be connected with the first emission control line EL1. In response to the first emission control signal E1 having an active level supplied through the first emission control line EL1, the fourth transistor T4 may be turned on. The fourth transistor T4 may be turned on and may supply (or provide) a voltage of the first driving power source ELVDD to the first node N1.

The fifth transistor T5 may be connected between the third node N3 and the OLED OD and may operate in response to a second emission control signal E2. A first electrode (or a first terminal) of the fifth transistor T5 may be connected with the third node N3, and a second electrode (or a second terminal) of the fifth transistor T5 may be connected with an anode electrode of the OLED OD. A gate electrode (or a gate) of the fifth transistor T5 may be connected with the second emission control line EL2. In response to the second emission control signal E2 having an active level supplied through the second emission control line EL2, the fifth transistor T5 may be turned on. The fifth transistor T5 may be turned on and may electrically connect the third node N3 with the anode electrode of the OLED OD.

The sixth transistor T6 may be connected between the read-out line ROL and the third node N3 and may operate in response to a read-out/initialization control signal R. A first electrode (or a first terminal) of the sixth transistor T6 may be connected with the read-out line ROL, and a second electrode (or a second terminal) of the sixth transistor T6 may be connected with the third node N3. A gate electrode (or a gate) of the sixth transistor T6 may be connected with the read-out/initialization control line RL. In response to the read-out/initialization control signal R supplied through the read-out/initialization control line RL, the sixth transistor T6 may be turned on. The sixth transistor T6 may be turned on and may supply a voltage of an initialization power source VINT to the third node N3. In some embodiments, the sixth transistor T6 may be turned on and may electrically connect the third node N3 with the read-out line ROL. The storage capacitor CST may be connected between the first node N1 and the second node N2.

In an embodiment, the pixel PX1 may perform a reset operation in a reset period. In the reset period, a voltage of the initialization power source VINT may be applied to the third node N3 through the read-out line ROL. In a program period after the reset period, the pixel PX1 may perform a program operation. In the program period, a data voltage VD may be applied to the first node N1 through the data line DL. In a hold period after the program period, the pixel PX1 may perform a hold operation. In the hold period, the second to sixth transistors T2 to T6 may all be turned off. In an emission period after the hold period, the pixel PX1 may perform an emission operation. In the emission period, the fourth and fifth transistors T4 and T5 may be turned on, and thus, a driving current ID may be supplied to the OLED OD and the OLED OD may emit light having luminance corresponding to the driving current ID.

In an embodiment, a voltage of the first driving power source ELVDD may be higher than a voltage of the second driving power source ELVSS. A voltage of the initialization power source VINT may be lower than a voltage which is obtained as a voltage of the first driving power source ELVDD decreases by a threshold voltage VTH of the first transistor T1. That is, a voltage of the initialization power source VINT may satisfy the following expression shown in Equation 1.

$$V\,INT < ELVDD - V\,TH \qquad \text{[Equation 1]}$$

In an embodiment, the pixel PX1 may include a first parasitic capacitor between a gate of the second transistor T2 and a second electrode (i.e., the first node N1) of the second transistor T2. The pixel PX1 may include a second parasitic capacitor between a gate of the third transistor T3 and a first electrode (i.e., the second node N2) of the third transistor T3. Based on the first and second parasitic capacitors, a range of the data voltage VD may increase.

The pixel PX1 according to an embodiment may extend a range of a data voltage, which is reduced for a small area and a high resolution, by using the first and second parasitic capacitors and the storage capacitor. Therefore, the display apparatus 100 may easily control the brightness of pixels.

In the pixel PX1 according to an embodiment, the fourth transistor T4 and the fifth transistor T5 may independently operate. The scan driver 113 may independently control the fourth transistor T4 and the fifth transistor T5. A gate of the fourth transistor T4 may be connected with the first emission control line EL1, and a gate of the fifth transistor T5 may be connected with the second emission control line EL2. The fourth transistor T4 may operate in response to the first emission control signal E1, and the fifth transistor T5 may operate in response to the second emission control signal E2, which differs from the first emission control signal E1. The scan driver 113 may independently control the first emission control signal E1 and the second emission control signal E2. Therefore, the display apparatus 100 according to an embodiment may control an emission time to implement pulse width modulation (PWM). A more detailed description of PWM will be described with reference to FIGS. 17A to 17C.

In the pixel PX1 according to an embodiment, the sixth transistor T6 may supply the read-out signal RO to the read-out circuit (114 of FIG. 1). In response to the read-out/ initialization control signal R having an active level, the pixel PX1 may output the read-out signal RO to the read-out line ROL. That is, the pixel PX1 may perform a read-out operation in a read-out period.

The read-out operation may be an operation for testing an electrical characteristic of a pixel. In an embodiment, the display apparatus 100 may perform a read-out operation at a test step in a manufacturing process. In some embodiments, the read-out operation may be an operation which measures the degree of degradation in pixel over time while a user is using the display apparatus 100 and compensates for the measured degradation.

In an embodiment, the read-out circuit 114 may detect a driving current, a threshold voltage, or a forward voltage. The read-out period may include a first read-out period RO1, a second read-out period RO2, and a third read-out period RO3. The first read-out period RO1 may be a period where the driving current ID is measured, the second read-out period RO2 may be a period where the threshold voltage VTH is measured, and the third read-out period RO3 may be a period where the forward voltage VF is measured. More detailed descriptions of the read-out operation and the read-out period will be described below.

As described above, the display apparatus 100 according to an embodiment may extend a range of a data voltage and may easily control the brightness of pixels. The display apparatus 100 may control dimming of a pulse amplitude modulation (PAM) scheme and a PWM scheme and may enhance brightness expression (or a gray level). The display apparatus 100 may measure the driving current, the threshold voltage, or the forward voltage through a secured design for test (DFT) path in a wafer or package state and may implement DFT.

Figure 3:
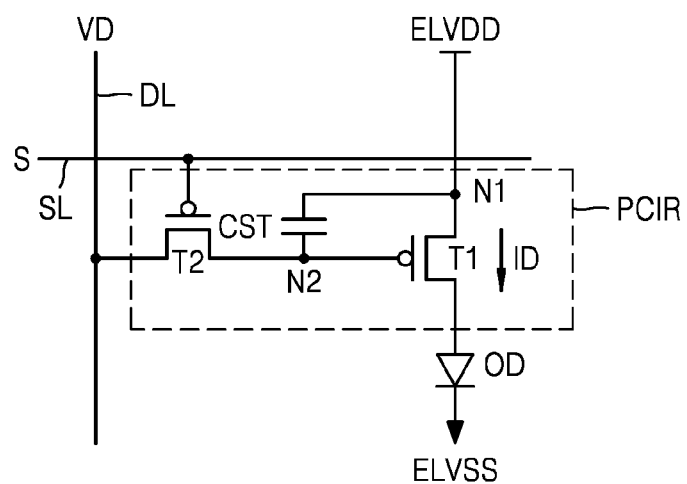
FIG. 3 is a circuit diagram illustrating an implementation example of a pixel, according to an embodiment.

FIG. 3 is a circuit diagram illustrating an implementation example of a pixel.

Referring to FIG. 3, a pixel PXa may include an OLED OD and a pixel circuit PCIR. An anode electrode of the OLED OD may be connected with the pixel circuit PCIR, and a cathode electrode thereof may be connected with a second driving power source ELVSS. The OLED OD may emit light having luminance corresponding to the amount of current supplied from the pixel circuit PCIR.

The pixel circuit PCIR may control the amount of current flowing to the second driving power source ELVSS via the OLED OD from a first driving power source ELVDD, based on a data voltage VD. The pixel circuit PCIR may include a first transistor T1, a second transistor T2, and a storage capacitor CST. At least one of the first transistor T1 and the second transistor T2 may be implemented with a MOSFET or an LTPS thin film transistor including an active layer including an oxide semiconductor thin film transistor polysilicon including an active layer including an oxide semiconductor.

A first electrode of the first transistor T1 may be connected with the first driving power source ELVDD, and a second electrode thereof may be connected with an anode electrode of the OLED OD. A gate electrode (or a gate) of the first transistor T1 may be connected with the second node N2. The first transistor T1 may control the amount of current flowing to the second driving power source ELVSS via the OLED OD from the first driving power source ELVDD, based on a voltage of the second node N2.

A first electrode of the second transistor T2 may be connected with a data line DL, and a second electrode thereof may be connected with the second node N2. A gate electrode of the second transistor T2 may be connected with a scan line SL. The storage capacitor CST may be connected between the first node N1 and the second node N2.

A scan signal (i.e., a scan signal S having an active level) may be applied through the scan line SL. The second transistor T2 may be turned on in response to the scan signal S having an active level. The second transistor T2 may be turned on and may transfer a data voltage VD, supplied through the data line DL, to the second node N2. The first transistor T1 may transfer a driving current ID to the OLED OD in response to the data voltage VD.

Figure 4:
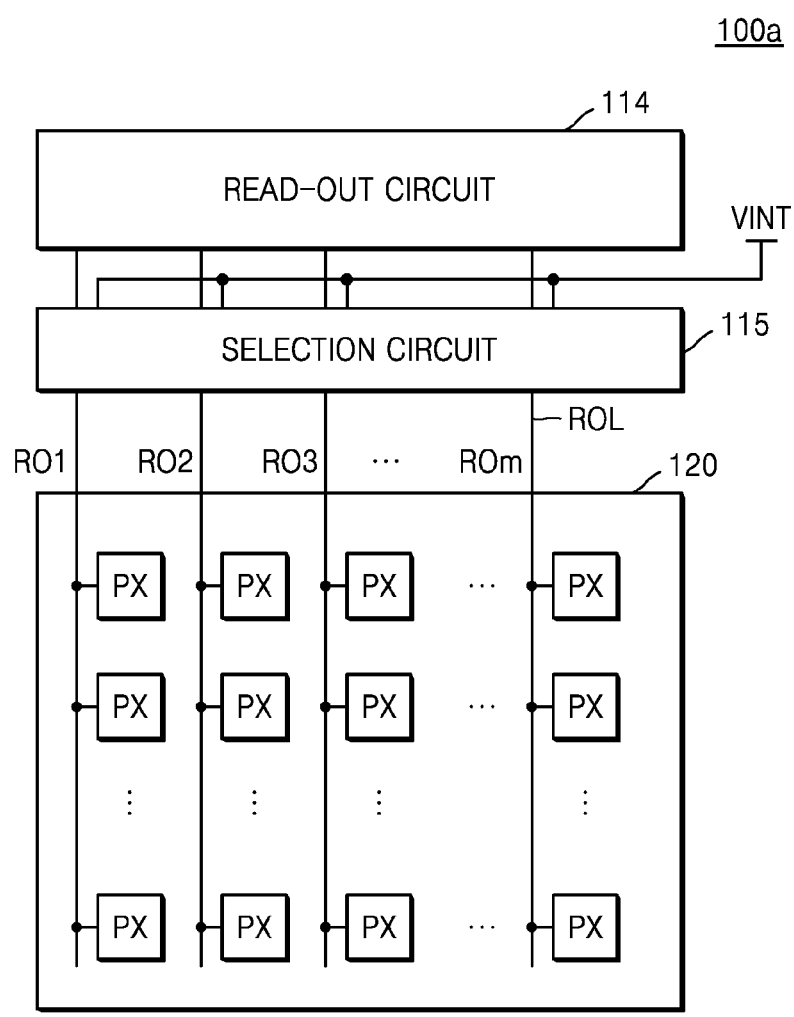
FIG. 4 is a block diagram illustrating a display apparatus according to an embodiment.

FIG. 4 is a block diagram illustrating a display apparatus 100a according to an embodiment.

Referring to FIG. 4, the display apparatus 100a may include a read-out circuit 114, a selection circuit 115, and a display panel 120. For convenience of description, only the read-out circuit 114, the selection circuit 115, and the display panel 120 are illustrated in FIG. 4, but the display apparatus 100a may further include other elements (for example, the control logic circuit 111, the data driver 112, and the scan driver 113 of the display apparatus 100 of FIG. 1).

Referring to FIGS. 1, 2, and 4, in some embodiments, the display driving circuit 110 of FIG. 1 may further include the selection circuit 115. The selection circuit 115 may be connected with a read-out line ROL and an initialization power source VINT, or may be connected with the read-out line ROL and the read-out circuit 114. That is, the selection circuit 115 may connect the read-out line ROL with one of the initialization power source VINT and the read-out circuit 114.

In a reset period, the selection circuit 115 may electrically connect the read-out line ROL with the initialization power source VINT. In the reset period, the selection circuit 115 may supply a voltage of the initialization power source VINT to a pixel PX through the read-out line ROL.

In a read-out period, the selection circuit 115 may electrically connect the read-out line ROL with the read-out circuit 114. In the read-out period, the selection circuit 115 may transfer a plurality of read-out signals RO1 to ROm, received through a plurality of read-out lines ROL, to the read-out circuit 114.

Figure 5:
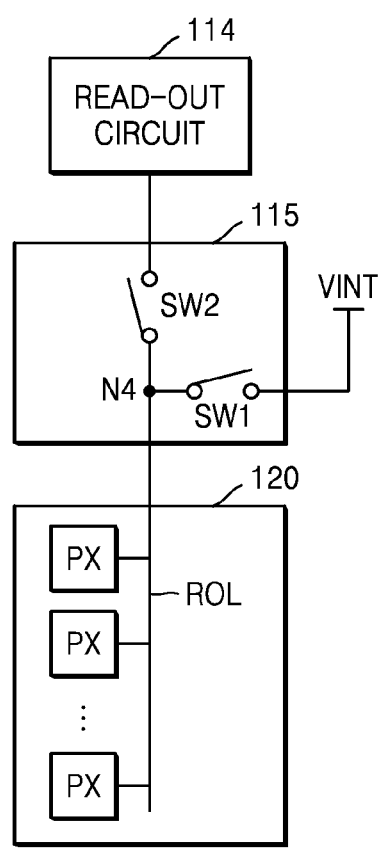
FIG. 5 is a block diagram illustrating a display apparatus according to an embodiment.

FIG. 5 is a block diagram illustrating a display apparatus 100a according to an embodiment.

For convenience of description, only pixels of one column are illustrated, and in FIG. 5, only a read-out circuit 114, a selection circuit 115, and a display panel 120 are illustrated. However, in some embodiments, the display apparatus 100a may further include other elements (for example, the control logic circuit 111, the data driver 112, and the scan driver 113 of the display apparatus 100 of FIG. 1).

A first switch SW1 may be connected between a fourth node N4 and an initialization power source VINT. The first switch SW1 may be connected between a read-out line ROL and an initialization power node to which an initialization voltage is supplied. A second switch SW2 may be connected between the fourth node N4 and a read-out circuit 114. The second switch SW2 may be connected between the read-out line ROL and the read-out circuit 114. The pixel PX may be connected with the fourth node N4 through a corresponding read-out line ROL.

In an embodiment, the scan driver 113 of FIG. 1 may control the first switch SW1 and the second switch SW2. The scan driver 113 may output a signal for driving the first switch SW1 and the second switch SW2.

In a reset period, the first switch SW1 may be turned on and the second switch SW2 may be turned off. When the first switch SW1 is turned on and the second switch SW2 is turned off, a voltage of the initialization power source VINT may be supplied to the pixel PX through the read-out line ROL.

In a read-out period, the first switch SW1 may be turned off and the second switch SW2 may be turned on. When the first switch SW1 is turned off and the second switch SW2 is turned on, read-out signals RO1 to ROm may be output to the read-out pixel 114 through the read-out line ROL.

In a first read-out period, the read-out circuit 114 may generate data corresponding to a driving current, based on a signal received through the read-out line ROL. In a second read-out period, the read-out circuit 114 may generate data corresponding to a threshold voltage, based on a signal received through the read-out line ROL. In a third read-out period, the read-out circuit 114 may generate data corresponding to a forward voltage, based on a signal received through the read-out line ROL.

Figure 6:
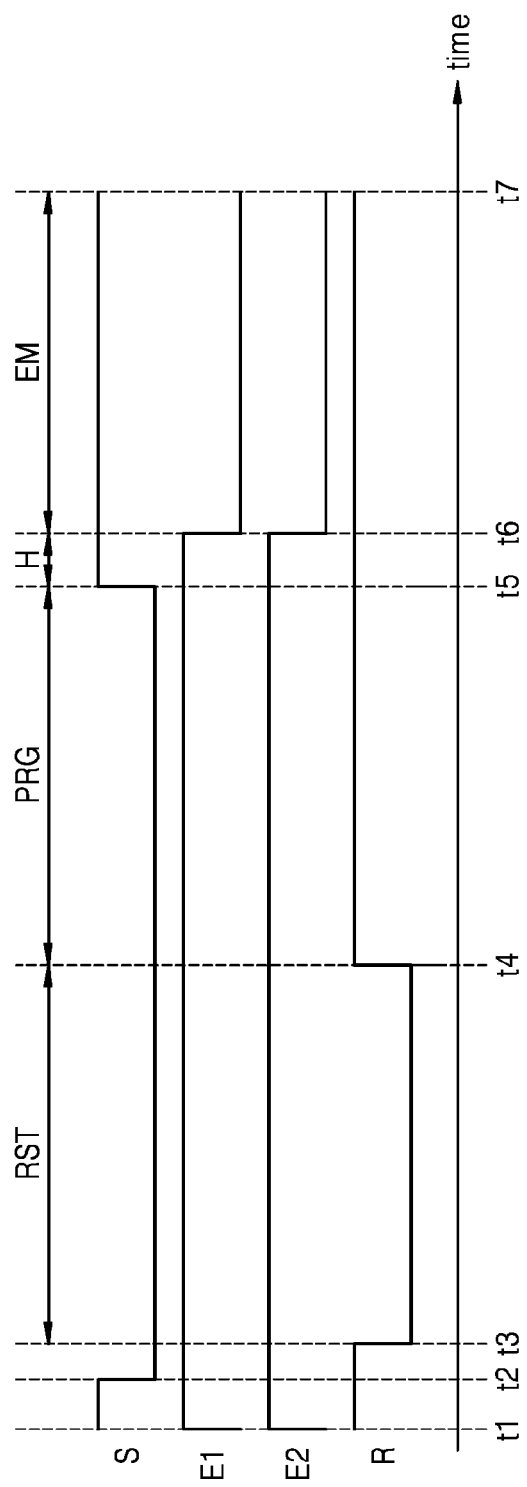
FIG. 6 is a timing diagram showing a plurality of signals for controlling a pixel, according to an embodiment.

FIG. 6 is a timing diagram showing a plurality of signals for controlling a pixel, according to an embodiment. FIGS. 7A to 7D are diagrams for describing an operation of a pixel according to an embodiment. A plurality of signals may be supplied to the pixel PX1 of FIG. 2 and will be described in conjunction with FIG. 2.

The scan driver 113 may supply the plurality of control signals to the display panel 120 through the plurality of control lines. The scan driver 113 may control the pixel PX1 by using the plurality of control signals. The display apparatus 100 may operate by frame units. Each frame may include a reset period RST, a program period PRG, a hold period H, and an emission period EM.

A scan signal S may be logic high (for example, a high level, a first level, an inactive level, or a turn-off level) up to a second time t2 from a first time t1, the scan signal S may be logic low (for example, a low level, a second level, an active level, or a turn-on level) up to a fifth time t5 from the second time t2, and the scan signal S may be logic high after the fifth time t5. The scan signal S may be shifted from a logic high level to a logic low level at the second time t2, and the scan signal S may be shifted from a logic low level to a logic high level at the fifth time t5.

A first emission control signal E1 may be logic high up to a sixth time t6 from the first time t1, and the first emission control signal E1 may be logic low after the sixth time t6. The first emission control signal E1 may be shifted from a logic low level to a logic high level at the first time t1, and the first emission control signal E1 may be shifted from a logic high level to a logic low level at the sixth time t6.

A second emission control signal E2 may be logic high up to the sixth time t6 from the first time t1, and the second emission control signal E2 may be logic low after the sixth time t6. The second emission control signal E2 may be shifted from a logic low level to a logic high level at the first time t1. The second emission control signal E2 may be shifted from a logic high level to a logic low level at the sixth time t6.

A read-out/initialization control signal R may be logic high up to a third time t3 from the first time t1, the read-out/initialization control signal R may be logic low up to a fourth time t4 from the third time t3, and the read-out/initialization control signal R may be logic high after the fourth time t4. The read-out/initialization control signal R may be shifted from a logic high level to a logic low level at the third time t3. The read-out/initialization control signal R may be shifted from a logic low level to a logic high level at the fourth time t4.

The reset period RST may be up to the fourth time t4 from the third time t3, the program period PRG may be up to the fifth time t5 from the fourth time t4, the hold period H may be up to the sixth time t6 from the fifth time t5, and the emission period EM may be up to a seventh time t7 from the sixth time t6.

Figure 7A:
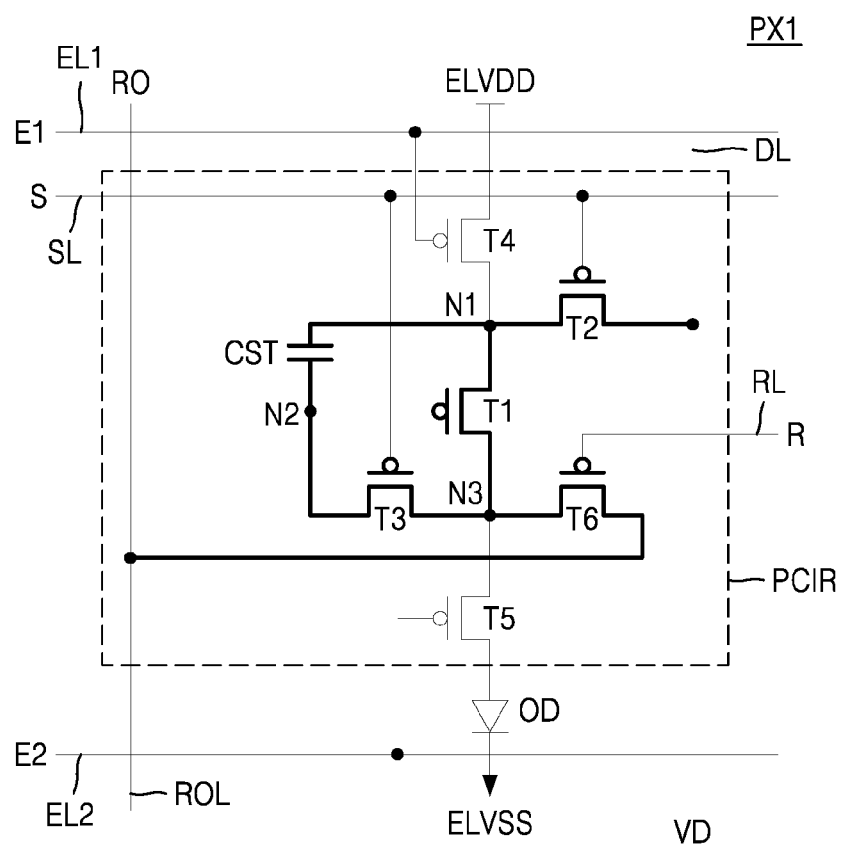
FIGS. 7A to 7D are diagrams for describing an operation of a pixel according to some embodiments.

Referring to FIGS. 6 and 7A, in the reset period RST, the scan signal S may be logic low, the first emission control signal E1 may be logic high, the second emission control signal E2 may be logic high, and the read-out/initialization control signal R may be logic low. In other words, in the reset period RST, the scan driver 113 may output the scan signal S having an active level through the scan line SL, output the first emission control signal E1 having an inactive level through the first emission control line EL1, output the second emission control signal E2 having an inactive level through the second emission control line EL2, and output the read-out/initialization control signal R having an active level through the read-out/initialization control line RL. Therefore, in the reset period RST, the fourth transistor T4 and the fifth transistor T5 may be turned off, and the second transistor T2, the third transistor T3, and the sixth transistor T6 may be turned on based on the scan signal S, the first emission control signal E1, the second emission control signal E2, and the read-out/initialization control signal R.

In response to the first emission control signal E1 having an inactive level, the fourth transistor T4 may be turned off. The fourth transistor T4 may be turned off and may cut off an electrical connection between the first driving power source ELVDD and the first node N1. In response to the second emission control signal E2 having an inactive level, the fifth transistor T5 may be turned off. The fifth transistor T5 may be turned off and may cut off an electrical connection between the third node N3 and the OLED OD.

In response to the scan signal S having an active level, the second transistor T2 may be turned on. The second transistor T2 may be turned on, and the data line DL may be electrically connected with the first node N1. A data voltage supplied through the data line DL may be transferred to the first node N1. In response to the scan signal S having an active level, the third transistor T3 may be turned on. The third transistor T3 may be turned on, and the second node N2 may be electrically connected with the third node N3. In response to the read-out/initialization control signal R having an active level, the sixth transistor T6 may be turned on. The sixth transistor T6 may be turned on and may transfer a voltage of the initialization power source VINT, supplied through the read-out line ROL, to the third node N3.

In other words, a voltage of the initialization power source VINT may be supplied to the third node N3, the third transistor T3 may be turned on, and the third node N3 may be electrically connected with the second node N2. A voltage of the initialization power source VINT may be supplied to the second node N2. That is, a voltage at a gate of the first transistor T1 may be initialized to a voltage of the initialization power source VINT.

The storage capacitor CST may be charged with a voltage which is obtained as a voltage of the first node N1 decreases by a voltage of the initialization power source VINT. That is, the storage capacitor CST may store a difference voltage between a voltage of the first node N1 and a voltage of the initialization power source VINT. In other words, the storage capacitor CST may store a difference voltage between a data voltage and a voltage of the initialization power source VINT.

In response to the scan signal S having an active level, the third transistor T3 may be turned on and may provide a diode connection of the first transistor T1. Therefore, in the reset period RST, a static current may flow from the data line DL to the read-out line ROL. That is, due to the static current, power may be additionally consumed. However, the pixel PX1 may include six transistors (i.e., the first to sixth transistors T1 to T6). Based on a reduction in the number of transistors per pixel, a pixel size may decrease. Accordingly, a display apparatus having a small area and a high resolution may be provided.

Figure 7B:
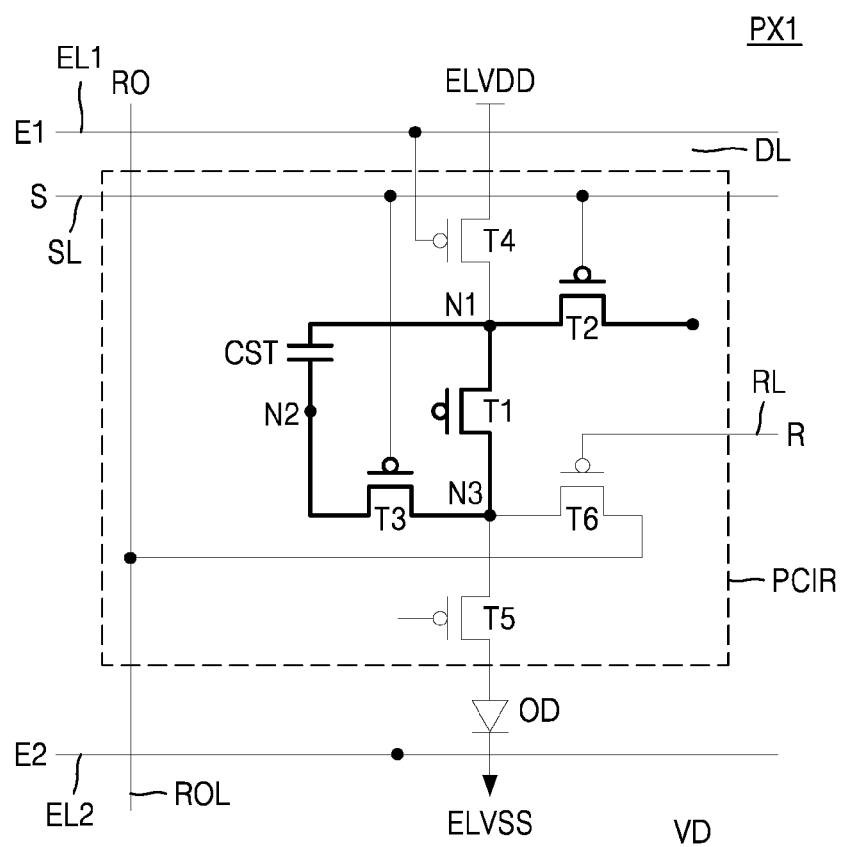

Referring to FIGS. 6 and 7B, in the program period PRG, the scan signal S may be logic low, the first emission control signal E1 may be logic high, the second emission control signal E2 may be logic high, and the read-out/initialization control signal R may be logic high. In other words, in the program period PRG, the scan driver 113 may output the scan signal S having an active level through the scan line SL, output the first emission control signal E1 having an inactive level through the first emission control line EL1, output the second emission control signal E2 having an inactive level through the second emission control line EL2, and output the read-out/initialization control signal R having an inactive level through the read-out/initialization control line RL.

In the program period PRG, the fourth transistor T4, the fifth transistor T5, and the sixth transistor T6 may be turned off and the second transistor T2 and the third transistor T3 may be turned on based on the scan signal S, the first emission control signal E1, the second emission control signal E2, and the read-out/initialization control signal R.

In response to the first emission control signal E1 having an inactive level, the fourth transistor T4 may be turned off. The fourth transistor T4 may be turned off and may cut off an electrical connection between the first driving power source ELVDD and the first node N1. In response to the second emission control signal E2 having an inactive level, the fifth transistor T5 may be turned off. The fifth transistor T5 may be turned off and may cut off an electrical connection between the third node N3 and the OLED OD. In response to the read-out/initialization control signal R having an inactive level, the sixth transistor T6 may be turned off. The sixth transistor T6 may be turned off and may cut off an electrical connection between the read-out line ROL and the third node N3.

In response to the scan signal S having an active level, the second transistor T2 may be turned on. The second transistor T2 may be turned on and may transfer a data voltage VD, supplied through the data line DL, to the first node N1. In response to the scan signal S having an active level, the third transistor T3 may be turned on. The third transistor T3 may be turned on and may connect the second node N2 with the third node N3 to provide a diode connection of the first transistor T1.

The data voltage VD may be applied to the first node N1, and a voltage, which is obtained as the data voltage VD decreases by an absolute value of a threshold voltage VTH, may be applied to the second node N2. The storage capacitor CST may be charged by the threshold voltage VTH. That is, the storage capacitor CST may store the threshold voltage VTH.

Figure 7C:
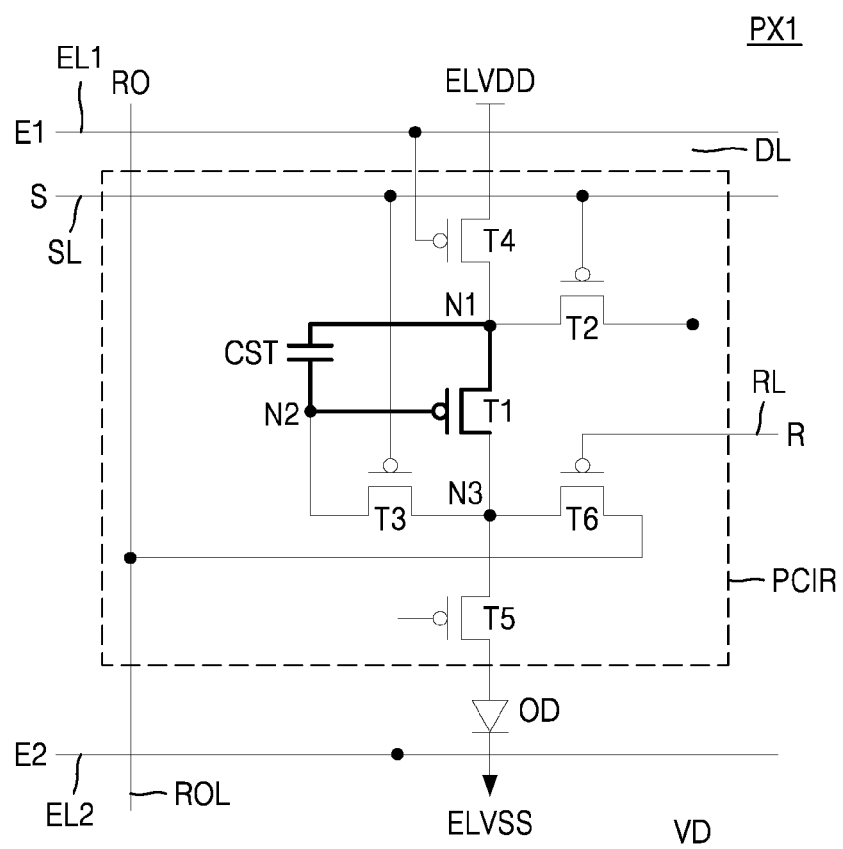

Referring to FIGS. 6 and 7C, in the hold period H, the scan signal S may be logic high, the first emission control signal E1 may be logic high, the second emission control signal E2 may be logic high, and the read-out/initialization control signal R may be logic high.

In other words, in the hold period H, the scan driver 113 may output the scan signal S having an inactive level through the scan line SL, output the first emission control signal E1 having an inactive level through the first emission control line EL1, output the second emission control signal E2 having an inactive level through the second emission control line EL2, and output the read-out/initialization control signal R having an inactive level through the read-out/initialization control line RL.

In the hold period H, the second transistor T2, the third transistor T3, the fourth transistor T4, the fifth transistor T5, and the sixth transistor T6 may be turned off based on the scan signal S, the first emission control signal E1, the second emission control signal E2, and the read-out/initialization control signal R.

In response to the scan signal S having an inactive level, the second transistor T2 may be turned off. The second transistor T2 may be turned off and may cut off an electrical connection between the data line DL and the first node N1. In response to the scan signal S having an inactive level, the third transistor T3 may be turned off. The third transistor T3 may be turned off and may cut off an electrical connection between the second node N2 and the third node N3. In response to the first emission control signal E1 having an inactive level, the fourth transistor T4 may be turned off. The fourth transistor T4 may be turned off and may cut off an electrical connection between the first driving power source ELVDD and the first node N1. In response to the second emission control signal E2 having an inactive level, the fifth transistor T5 may be turned off. The fifth transistor T5 may be turned off and may cut off an electrical connection between the third node N3 and the OLED OD. In response to the read-out/initialization control signal R having an inactive level, the sixth transistor T6 may be turned off. The sixth transistor T6 may be turned off and may cut off an electrical connection between the read-out line ROL and the third node N3.

In an embodiment, a range of a data voltage may extend due to an influence of a parasitic capacitor. A first parasitic capacitor (not shown) may be provided between the gate electrode of the second transistor T2 and the second electrode (i.e., the first node N1) of the second transistor T2. When the scan signal S is shifted from a logic low level to a logic high level at the fifth time t5 (i.e., a rising edge), a voltage of the first node N1 may be coupled to the scan signal S and may increase. A first voltage V1 may be applied to the first node N1. The first voltage V1 may be expressed as the following Equation 2. Here, VD may denote a data voltage VD applied through the data line DL, and f(A) may denote a level of a voltage which has increased due to the first parasitic capacitor.

$$V1 = VD + f(A) \qquad \text{[Equation 2]}$$

A second parasitic capacitor (not shown) may be provided between a gate electrode of the third transistor T3 and the first electrode (i.e., the second node N2) of the third transistor T3. When the scan signal S is shifted from a logic low level to a logic high level at the fifth time t5, a voltage of the second node N2 may be coupled to the scan signal S and may increase. A second voltage V2 may be applied to the second node N2. The second voltage V2 may be expressed as the following Equation 3. Here, VD may denote the data voltage VD applied through the data line DL, and f(B) may denote a level of a voltage which has increased due to the second parasitic capacitor.

$$V2 = VD - |V\,TH| + f(B) \qquad \text{[Equation 3]}$$

Figure 7D:
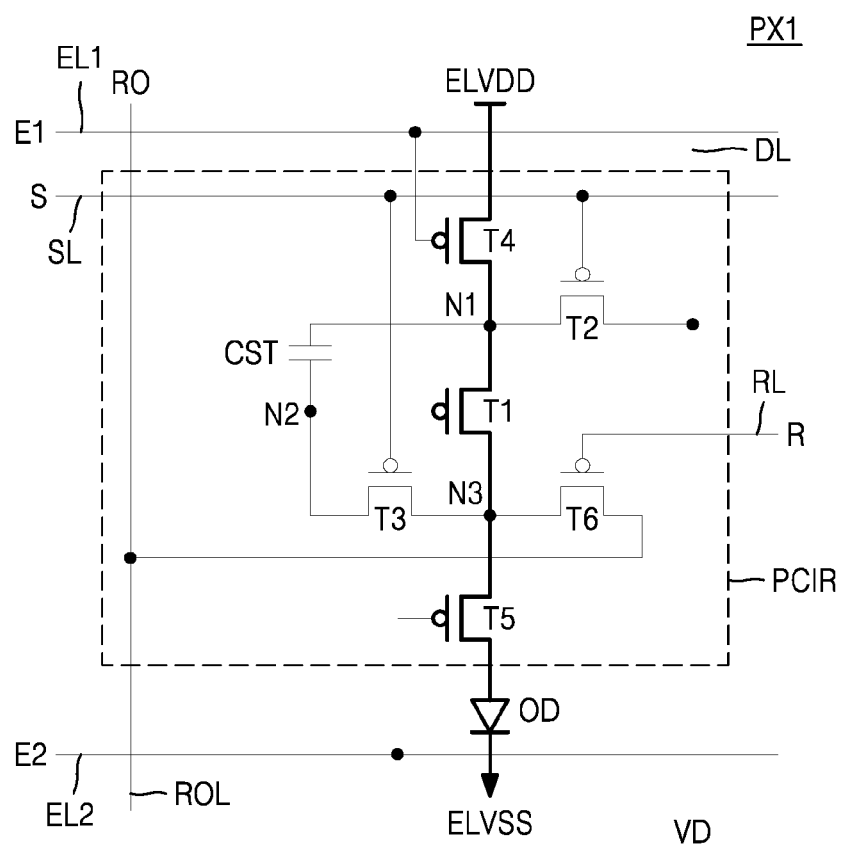

Referring to FIGS. 6 and 7D, in the emission period EM, the scan signal S may be logic high, the first emission control signal E1 may be logic low, the second emission control signal E2 may be logic low, and the read-out/initialization control signal R may be logic high. In other words, in the emission period EM, the scan driver 113 may output the scan signal S having an inactive level through the scan line SL, output the first emission control signal E1 having an active level through the first emission control line EL1, output the second emission control signal E2 having an active level through the second emission control line EL2, and output the read-out/initialization control signal R having an inactive level through the read-out/initialization control line RL. In the emission period EM, the second transistor T2, the third transistor T3, and the sixth transistor T6 may be turned off, and the fourth transistor T4 and the fifth transistor T5 may be turned on based on the scan signal S, the first emission control signal E1, the second emission control signal E2, and the read-out/initialization control signal R.

In response to the scan signal S having an inactive level, the second transistor T2 may be turned off. The second transistor T2 may be turned off and may cut off an electrical connection between the data line DL and the first node N1. In response to the scan signal S having an inactive level, the third transistor T3 may be turned off. The third transistor T3 may be turned off and may cut off an electrical connection between the second node N2 and the third node N3. In response to the read-out/initialization control signal R having an inactive level, the sixth transistor T6 may be turned off. The sixth transistor T6 may be turned off and may cut off an electrical connection between the read-out line ROL and the third node N3.

In response to the first emission control signal E1 having an active level, the fourth transistor T4 may be turned on. In response to the second emission control signal E2 having an active level, the fifth transistor T5 may be turned on. The fourth and fifth transistors T4 and T5 may all be turned on, and the first transistor T1 may transfer the driving current ID to the OLED OD such that the driving current ID corresponding to the data voltage VD may flow in the OLED OD via the first transistor T1.

When a driving current ID is supplied to the first transistor T1, the OLED OD may emit light from an organic emission layer. The intensity of light may be proportional to the driving current ID. For example, the voltage of the first drive power supply ELVDD may be e applied to the first node N1. The third voltage V3 may be applied to the second node N2. The third voltage V3 may be represented by Equation 4. In Equations 4, α indicates a constant value, ELVDD indicates a voltage of the first drive power supply ELVDD, VD indicates the data voltage VD, VSG indicates a drive voltage VSG of the first transistor T1, VTH indicates the threshold voltage VTH of the first transistor T1, f(A) indicates the magnitude of a voltage increased by the first parasitic capacitor, and f(B) indicates the magnitude of a voltage increased by the second parasitic capacitor.

$$V3 = VD - |VTH| + f(B) + \alpha(ELVDD - VD - f(A)) \quad \text{Equation 4}$$

A driving voltage VSG of the first transistor T1 may be expressed as the following Equation 5, and the driving current ID may be expressed as the following Equation 6. Here, α may denote a constant value, ELVDD may denote a voltage of the first driving power source ELVDD, VD may denote the data voltage VD, VSG may denote a driving voltage VSG of the first transistor T1, VTH may denote a threshold voltage VTH of the first transistor T1, f(A) may denote a level of a voltage which has increased due to the first parasitic capacitor, and f(B) may denote a level of a voltage which has increased due to the second parasitic capacitor.

$$VSG = (1 - \alpha)(ELVDD - VD) - f(B) + \alpha f(A) + |VTH| \quad \text{[Equation 5]}$$

$$ID = \beta(VSG - VTH)^2 \quad \text{[Equation 6]}$$

The display apparatus 100 according to an embodiment may be implemented as in the following Equation 7 and may extend a range of a data voltage. In Equation 7, f(A) indicates the magnitude of a voltage increased by the first parasitic capacitor, and f(B) indicates the magnitude of a voltage increased by the second parasitic capacitor.

$$f(A) < f(B) \quad \text{[Equation 7]}$$

In an embodiment, a size (or a magnitude) of the second transistor T2 and a size of the third transistor T3 may differ. In some embodiments, the size of the transistor may be measured in nanometers, and may refer to a size of process technology used to fabricate the transistor. In some embodiments, the size of the transistor may refer to a magnitude of the current that can be handled by the transistor. A size of the second transistor T2 may be less than that of the third transistor T3. Due to a size difference between transistors, effects of parasitic capacitors may differ. Due to a size difference between transistors, an effect of the second parasitic capacitor may be greater than an effect of the first parasitic capacitor. A drive voltage VSG of the first transistor T1 may be reduced due to the influence of a parasitic capacitor (e.g. f(B)). That is, compared to the case without the parasitic capacitor, the drive voltage VSG is reduced even if the same data voltage VD is applied, so the range of the data voltage can be expanded.

As described above, a range of a data voltage corresponding to a range of the amount of current flowing in a pixel may increase. That is, a variation range of the data voltage VD corresponding to a variation range of the driving current ID may extend. The brightness or luminance of pixels may be easily controlled by using a data voltage.

Figure 8:
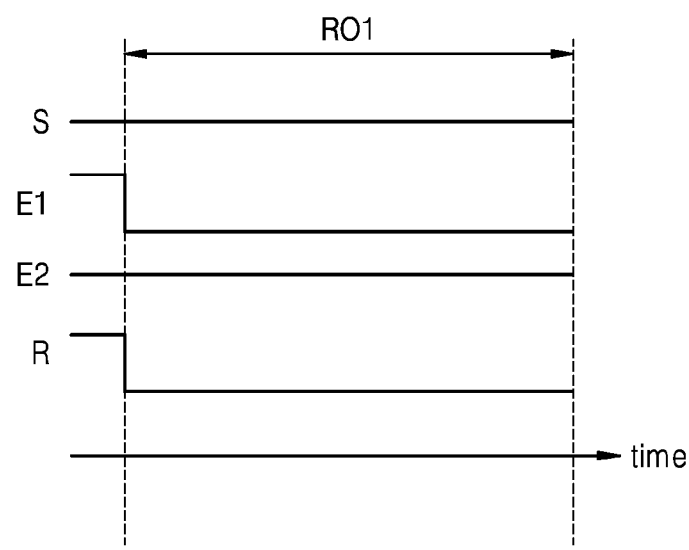
FIGS. 8 to 10 are timing diagrams showing a plurality of signals for controlling a pixel, according to some embodiments.
Figure 9:
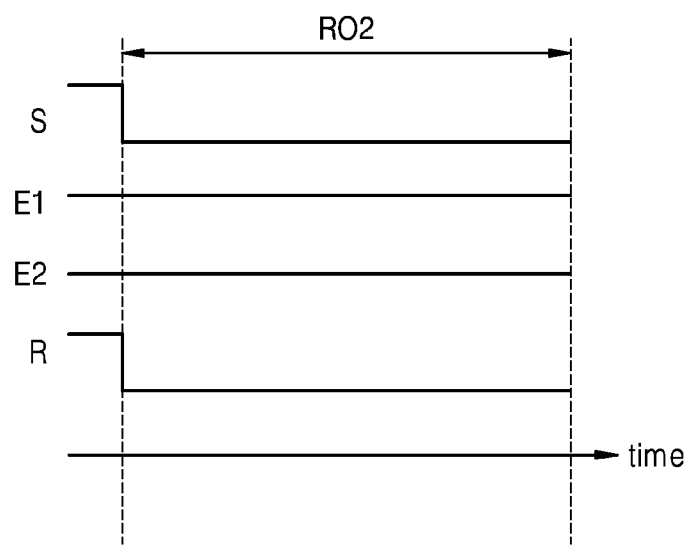
Figure 10:
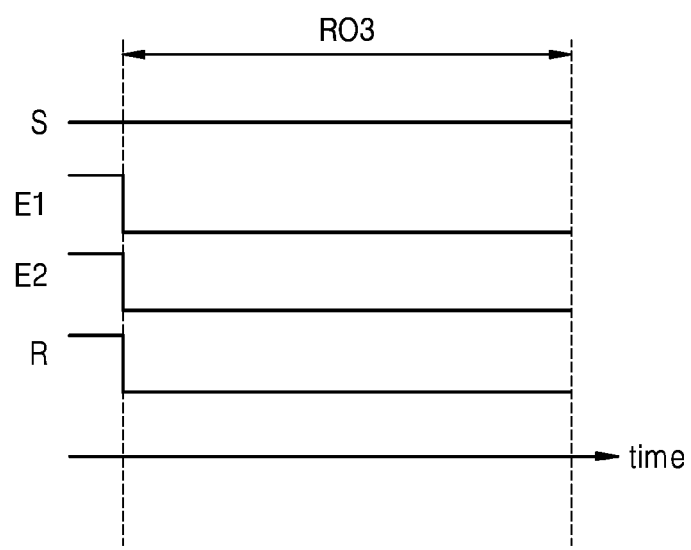
Figure 11A:
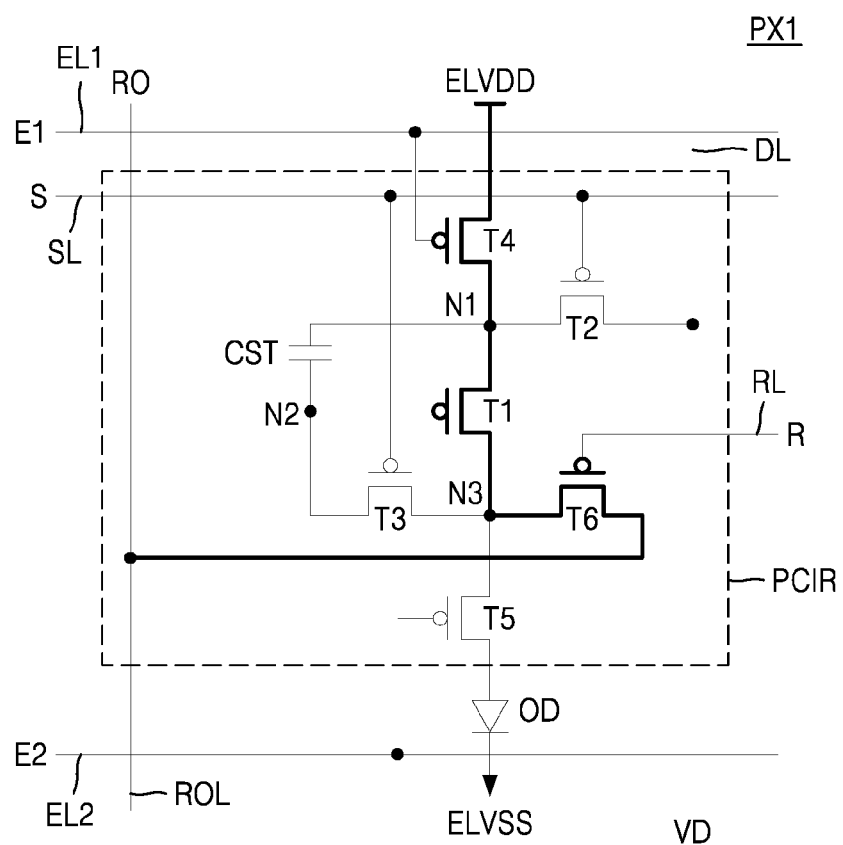
FIGS. 11A to 11C are diagrams for describing an operation of a pixel according to some embodiments.
Figure 11B:
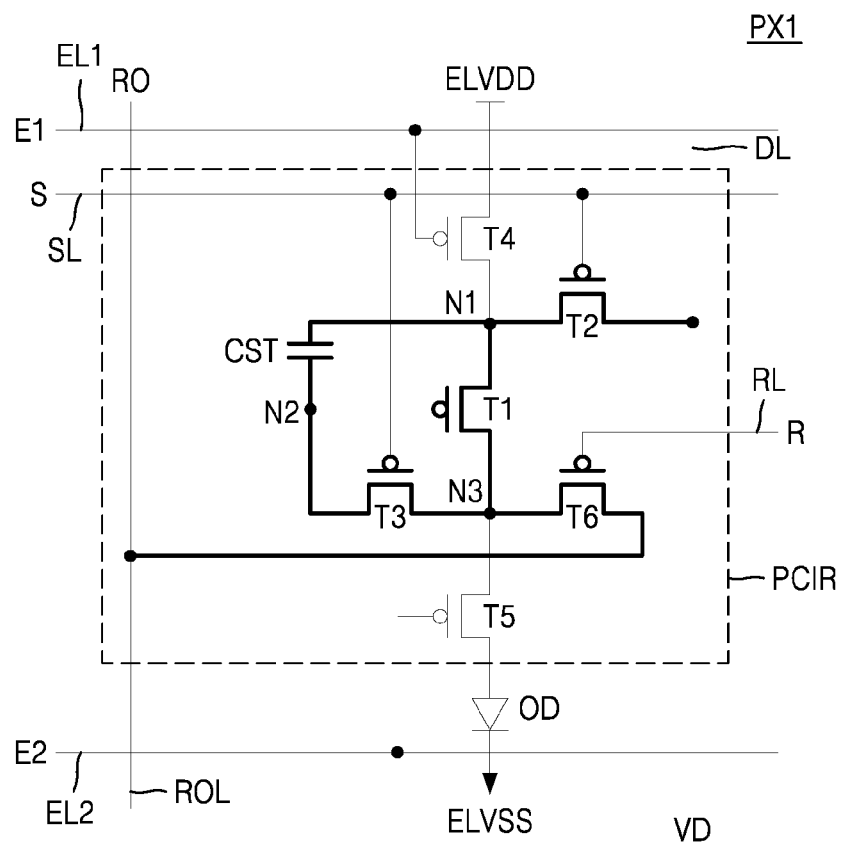
Figure 11C:
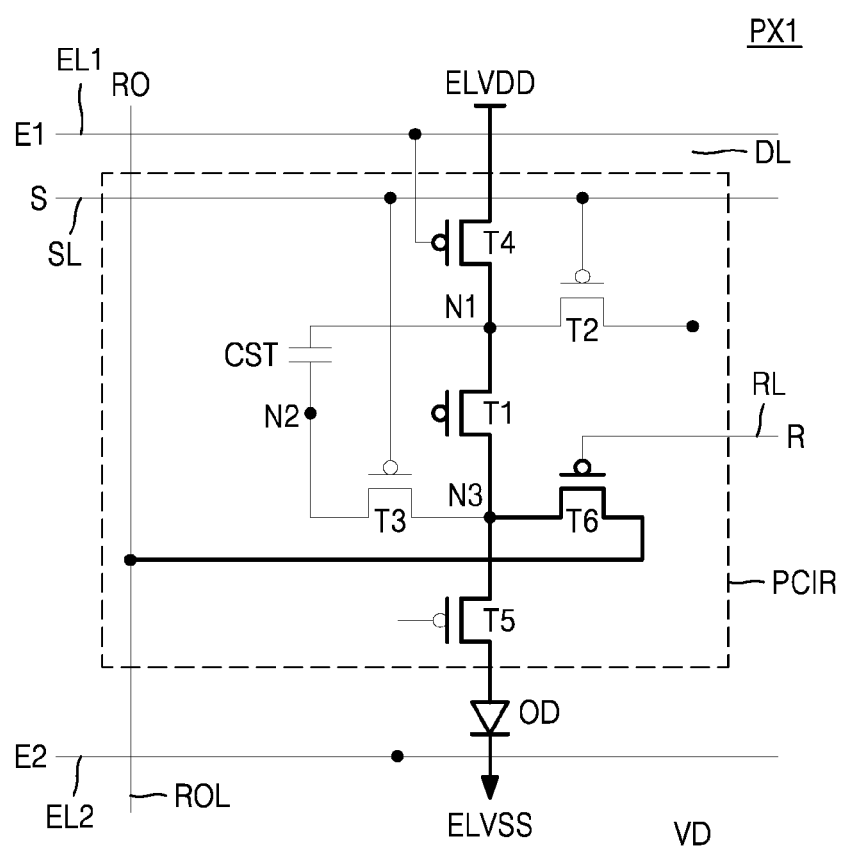

FIGS. 8 to 10 are timing diagrams showing a plurality of signals for controlling a pixel, according to an embodiment. FIGS. 11A to 11C are diagrams for describing an operation of a pixel according to an embodiment. A plurality of signals may be supplied to the pixel PX1 of FIG. 2 and will be described in conjunction with FIGS. 1 and 2.

In the read-out period, the pixel PX1 may output the read-out signal RO through the read-out line ROL. In the first read-out period RO1, the read-out circuit 114 may detect the driving current ID. After the hold period H, the display apparatus 100 may perform a first read-out operation instead of an emission operation. The first read-out operation may denote an operation of detecting the driving current ID. The display apparatus 100 may perform the first read-out operation in the first read-out period RO1. In the first read-out period RO1, the pixel PX1 may output the driving current ID to the read-out circuit 114 through the read-out line ROL.

In the second read-out period RO2, the read-out circuit 114 may detect the threshold voltage VTH. After the reset period RST, the display apparatus 100 may perform a second read-out operation instead of a program operation. The second read-out operation may denote an operation of detecting the threshold voltage VTH. The display apparatus 100 may perform the second read-out operation in the second read-out period RO2. In the second read-out period RO2, the pixel PX1 may output an output voltage VO to the read-out circuit 114. The output voltage VO may be expressed as the following Equation 8. Here, VD may denote the data voltage VD, and VTH may denote the threshold voltage VTH of the first transistor T1.

$$VO = VD - VTH \quad \text{[Equation 8]}$$

In the third read-out period RO3, the read-out circuit 114 may detect a forward voltage VF. After the hold period H, the display apparatus 100 may perform a third read-out operation instead of an emission operation. The third read-out operation may denote an operation of detecting the forward voltage VF. The display apparatus 100 may perform the third read-out operation in the third read-out period RO3. In the third read-out period RO3, the pixel PX1 may output the forward voltage VF (or a voltage of the third node N3) to the read-out circuit 114.

A method of measuring the driving current ID will be described with reference to FIGS. 8 and 11A. Referring to FIGS. 2, 8, and 11A, in the first read-out period RO1, the scan signal S may be logic high, the first emission control signal E1 may be logic low, the second emission control signal E2 may be logic high, and the read-out/initialization control signal R may be logic low. In other words, in the first read-out period RO1, the scan driver 113 may output the scan signal S having an inactive level through the scan line SL, output the first emission control signal E1 having an active level through the first emission control line EL1, output the second emission control signal E2 having an inactive level through the second emission control line EL2, and output the read-out/initialization control signal R having an active level through the read-out/initialization control line RL. In the first read-out period RO1, the second transistor T2, the third transistor T3, and the fifth transistor T5 may be turned off, and the fourth transistor T4 and the sixth transistor T6 may be turned on based on the scan signal S, the first emission control signal E1, the second emission control signal E2, and the read-out/initialization control signal R.

In response to the first emission control signal E1 having an active level, the fourth transistor T4 may be turned on. In response to the read-out/initialization control signal R having an active level, the sixth transistor T6 may be turned on. In response to the second emission control signal E2 having an inactive level, the fifth transistor T5 may be turned off. In response to the scan signal S having an inactive level, the second transistor T2 may be turned off. In response to the scan signal S having an inactive level, the third transistor T3 may be turned off.

The fifth transistor T5 may be turned off and the sixth transistor T6 may be turned on, and thus, the first transistor T1 may transfer the driving current ID such that the driving current ID (i.e., the read-out signal RO) may be output to the read-out circuit 114 through the read-out line ROL. The read-out circuit 114 may receive the driving current ID through the read-out line ROL. The read-out circuit 114 may analog-to-digital convert the received driving current ID to generate read-out data.

A method of measuring the threshold voltage VTH will be described with reference to FIGS. 9 and 11B. Referring to FIGS. 2, 9, and 11B, in the second read-out period RO2, the scan signal S may be logic low, the first emission control signal E1 may be logic high, the second emission control signal E2 may be logic high, and the read-out/initialization control signal R may be logic low. In other words, in the second read-out period RO2, the scan driver 113 may output the scan signal S having an active level through the scan line SL, output the first emission control signal E1 having an inactive level through the first emission control line EL1, output the second emission control signal E2 having an inactive level through the second emission control line EL2, and output the read-out/initialization control signal R having an active level through the read-out/initialization control line RL. In the second read-out period RO2, the fourth transistor T4 and the fifth transistor T5 may be turned off, and the second transistor T2, the third transistor T3, and the sixth transistor T6 may be turned on based on the scan signal S, the first emission control signal E1, the second emission control signal E2, and the read-out/initialization control signal R.

In response to the scan signal S having an active level, the second transistor T2 may be turned on. In response to the scan signal S having an active level, the third transistor T3 may be turned on. In response to the read-out/initialization control signal R having an active level, the sixth transistor T6 may be turned on. In response to the first emission control signal E1 having an inactive level, the fourth transistor T4 may be turned off. In response to the second emission control signal E2 having an inactive level, the fifth transistor T5 may be turned off.

In response to the scan signal S having an active level, the second transistor T2 may be turned on. The second transistor T2 may be turned on and may transfer the data voltage VD, supplied through the data line DL, to the first node N1. The data voltage VD may be applied to the first node N1. A voltage, which is obtained as the data voltage VD decreases by the absolute value of the threshold voltage VTH, may be applied to the second node N2.

In response to the scan signal S having an active level, the third transistor T3 may be turned on. The third transistor T3 may be turned on and may connect the second node N2 with the third node N3 to provide a diode connection of the first transistor T1. A voltage, which is obtained as the data voltage VD decreases by the absolute value of the threshold voltage VTH, may be applied to the third node N3 like the second node N2.

In response to the read-out/initialization control signal R having an active level, the sixth transistor T6 may be turned on. The sixth transistor T6 may be turned on and may electrically connect the third node N3 with the read-out line ROL. The output voltage VO may be output to the read-out line ROL.

The read-out circuit 114 may receive the output voltage VO through the read-out line ROL. The read-out circuit 114 may detect the threshold voltage VTH, based on the output voltage VO and the data voltage VD. The read-out circuit 114 may analog-to-digital convert the threshold voltage VTH to generate read-out data.

A method of measuring the forward voltage VF will be described with reference to FIGS. 10 and 11C. Referring to FIGS. 2, 10, and 11C, in the third read-out period RO3, the scan signal S may be logic high, the first emission control signal E1 may be logic low, the second emission control signal E2 may be logic low, and the read-out/initialization control signal R may be logic low. In other words, in the third read-out period RO3, the scan driver 113 may output the scan signal S having an inactive level through the scan line SL, output the first emission control signal E1 having an active level through the first emission control line EL1, output the second emission control signal E2 having an active level through the second emission control line EL2, and output the read-out/initialization control signal R having an active level through the read-out/initialization control line RL. In the reset period RST, the second transistor T2 and the third transistor T3 may be turned off, and the fourth transistor T4, the fifth transistor T5, and the sixth transistor T6 may be turned on based on the scan signal S, the first emission control signal E1, the second emission control signal E2, and the read-out/initialization control signal R.

In response to the first emission control signal E1 having an active level, the fourth transistor T4 may be turned on. In response to the second emission control signal E2 having an active level, the fifth transistor T5 may be turned on. In response to the read-out/initialization control signal R having an active level, the sixth transistor T6 may be turned on. In response to the scan signal S having an inactive level, the second transistor T2 may be turned off. In response to the scan signal S having an inactive level, the third transistor T3 may be turned off.

In response to the first emission control signal E1 having an active level, the fourth transistor T4 may be turned on. In response to the second emission control signal E2 having an active level, the fifth transistor T5 may be turned on. The fourth and fifth transistors T4 and T5 may all be turned on, and the first transistor T1 may transfer the driving current ID to the OLED OD such that the driving current ID may flow in the OLED OD. In response to the read-out/initialization control signal R having an active level, the sixth transistor T6 may be turned on. The sixth transistor T6 may be turned on and may electrically connect the third node N3 with the read-out line ROL. The forward voltage VF may be output through the read-out line ROL.

The read-out circuit 114 may receive the forward voltage VF through the read-out line ROL. The read-out circuit 114 may analog-to-digital convert the forward voltage VF to generate read-out data.

The display apparatus 100 according to an embodiments may detect an electrical characteristic of pixels at a test step. The display apparatus 100 may measure (or check) a level and a distribution of a driving current of the pixel PX1. The display apparatus 100 may measure the threshold voltage VTH to measure a distribution of a driving transistor (i.e., the first transistor T1). A defect of a pixel may be detected based on a driving current and a threshold voltage, and current uniformity may be secured. The display apparatus 100 may measure a level of a forward voltage, and thus, may measure the degree of degradation which occurs as the OLED OD is used for a long time. In the display apparatus 100, DFT may be applied thereto, and thus, the testability of the pixel PX1 may be secured even in a wafer and package state. Accordingly, the quality of semiconductor chips may be maintained, and test efficiency may be enhanced.

As described above, the pixel PX1 may include six transistors. The sixth transistor T6 may be turned on in the reset period RST and the read-out periods RO1 to RO3. That is, the sixth transistor T6 may control both an initialization operation and a read-out operation. The sixth transistor T6 may transfer a voltage of the initialization power source VINT to the third node N3 in the reset period RST. Also, the sixth transistor T6 may transfer the read-out signal RO to the read-out circuit 114 in the read-out periods RO1 to RO3. The sixth transistor T6 may control all of an initialization operation and a read-out operation, and thus, the number of transistors may be reduced. Based on a reduction in the number of transistors per pixel, a pixel size may decrease. Accordingly, a display apparatus having a smaller area and a higher resolution may be provided.

Figure 12:
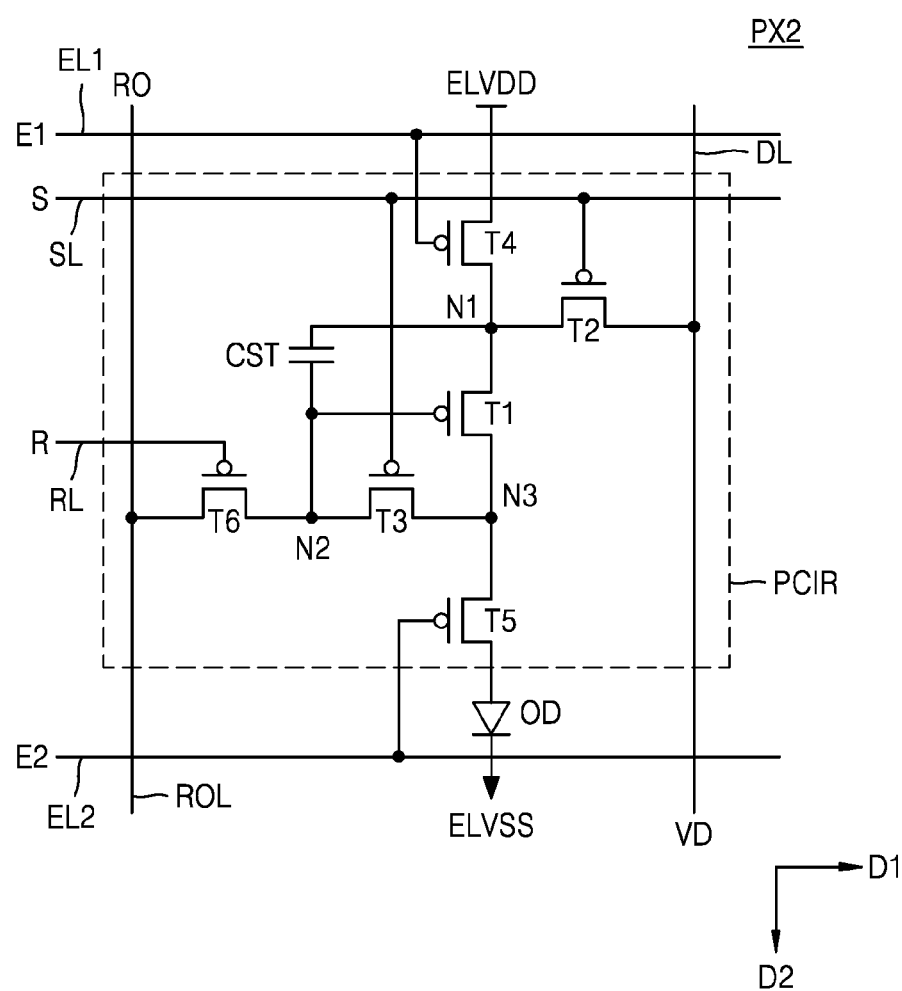
FIG. 12 is a circuit diagram illustrating an example of a pixel according to an embodiment.

FIG. 12 is a circuit diagram illustrating an example of a pixel PX2 according to an embodiment. The pixel PX2 of FIG. 12 may be applied to the display apparatus of FIG. 1. The pixel PX of FIG. 1 may include the pixel PX2 of FIG. 12. Hereinafter, for convenience of description, in describing the pixel PX2 of FIG. 12, detailed descriptions of elements which are the same as or similar to the elements of the pixel PX1 of FIG. 2 may be omitted for conciseness, and differences therebetween will be mainly described.

Referring to FIGS. 1 and 12, the pixel PX2 may include an OLED OD and a pixel circuit PCIR. The pixel PX2 may include a scan line SL extending in a first direction D1, a first emission control line EL1 extending in the first direction D1, a second emission control line EL2 extending in the first direction D1, a read-out/initialization control line RL extending in the first direction D1, a data line DL extending in a second direction D2 intersecting with the first direction D1, a read-out line ROL extending in the second direction D2, a first transistor T1, a second transistor T2, a third transistor T3, a fourth transistor T4, a fifth transistor T5, and a sixth transistor T6, a storage capacitor CST, and the OLED OD. For example, the first direction D1 may be an X-axis direction and the second direction D2 may be a Y-axis direction. An anode electrode of the OLED OD may be connected with the pixel circuit PCIR, and a cathode electrode thereof may be connected with a second driving power source ELVSS (or a ground node supplied with a ground voltage). The pixel circuit PCIR may include the first to sixth transistors T1 to T6 and the storage capacitor CST.

The first transistor T1 (or a driving transistor) may be connected between a first node N1 and a third node N3 and may operate in response to a voltage of the second node N2. A first electrode (or a first terminal) of the first transistor T1 may be connected with the first node N1, and a second electrode (or a second terminal) of the first transistor T1 may be connected with the third node N3. A gate electrode (or a gate) of the first transistor T1 may be connected with the second node N2. The first transistor T1 may control the amount of current flowing to the second driving power source ELVSS via the OLED OD from the first driving power source ELVDD, based on a voltage of the second node N2.

The second transistor T2 (or a selection transistor) may be connected between the data line DL and the first node N1 and may operate in response to the scan signal S. A first electrode (or a first terminal) of the second transistor T2 may be connected with the data line DL, and a second electrode (or a second terminal) of the second transistor T2 may be connected with the first node N1. A gate electrode (or a gate) of the second transistor T2 may be connected with the scan line SL. In response to the scan signal S having an active level supplied through the scan line SL, the second transistor T2 may be turned on. The second transistor T2 may be turned on and may be electrically connected with the first node N1 and the data line DL.

The third transistor T3 may be connected between the second node N2 and the third node N3 and may operate in response to the scan signal S. A first electrode (or a first terminal) of the third transistor T3 may be connected with the second node N2, and a second electrode (or a second terminal) of the third transistor T3 may be connected with the third node N3. A gate electrode (or a gate) of the third transistor T3 may be connected with the scan line SL. In response to the scan signal S having an active level supplied through the scan line SL, the third transistor T3 may be turned on. The third transistor T3 may be turned on and may be electrically connected with the second node N2 and the third node N3. That is, the third transistor T3 may provide a diode connection of the first transistor T1.

The fourth transistor T4 may be connected between the first driving power source ELVDD and the first node N1 and may operate in response to a first emission control signal E1. A first electrode (or a first terminal) of the fourth transistor T4 may be connected with the first driving power source ELVDD, and a second electrode (or a second terminal) of the second transistor T2 may be connected with the first node N1. A gate electrode (or a gate) of the fourth transistor T4 may be connected with the first emission control line EL1. In response to the first emission control signal E1 having an active level supplied through the first emission control line EL1, the fourth transistor T4 may be turned on. The fourth transistor T4 may be turned on and may supply a voltage of the first driving power source ELVDD to the first node N1.

The fifth transistor T5 may be connected between the third node N3 and the OLED OD and may operate in response to a second emission control signal E2. A first electrode (or a first terminal) of the fifth transistor T5 may be connected with the third node N3, and a second electrode (or a second terminal) of the fifth transistor T5 may be connected with an anode electrode of the OLED OD. A gate electrode (or a gate) of the fifth transistor T5 may be connected with the second emission control line EL2. In response to the second emission control signal E2 having an active level supplied through the second emission control line EL2, the fifth transistor T5 may be turned on. The fifth transistor T5 may be turned on and may electrically connect the third node N3 with the anode electrode of the OLED OD.

The sixth transistor T6 may be connected between the read-out line ROL and the second node N2 and may operate in response to a read-out/initialization control signal R. A first electrode (or a first terminal) of the sixth transistor T6 may be connected with the read-out line ROL, and a second electrode (or a second terminal) of the sixth transistor T6 may be connected with the second node N2. A gate electrode (or a gate) of the sixth transistor T6 may be connected with the read-out/initialization control line RL. In response to the read-out/initialization control signal R supplied through the read-out/initialization control line RL, the sixth transistor T6 may be turned on. The sixth transistor T6 may be turned on and may supply a voltage of an initialization power source VINT to the second node N2. In some embodiments, the sixth transistor T6 may be turned on and may electrically connect the second node N2 with the read-out line ROL. The storage capacitor CST may be connected between the first node N1 and the second node N2.

In an embodiment, the pixel PX2 may perform a reset operation in a reset period RST. In the reset period, a voltage of the initialization power source VINT may be applied to the second node N2 through the read-out line ROL. In a program period PRG after the reset period RST, the pixel PX2 may perform a program operation. In the program period PRG, a data voltage VD may be applied to the first node N1 through the data line DL. In a hold period H after the program period PRG, the pixel PX2 may perform a hold operation. In the hold period H, the second to sixth transistors T2 to T6 may all be turned off. In an emission period EM after the hold period H, the pixel PX2 may perform an emission operation. In the emission period EM, the fourth and fifth transistors T4 and T5 may be turned on, and thus, a driving current ID may be supplied to the OLED OD and the OLED OD may emit light having luminance corresponding to the driving current ID.

In an embodiment, a voltage of the first driving power source ELVDD may be higher than a voltage of the second driving power source ELVSS. A voltage of the initialization power source VINT may be lower than a voltage which is obtained as a voltage of the first driving power source ELVDD decreases by a threshold voltage VTH of the first transistor T1.

In an embodiment, the pixel PX2 may include a first parasitic capacitor between a gate of the second transistor T2 and a second electrode (i.e., the first node N1) of the second transistor T2. The pixel PX2 may include a second parasitic capacitor between a gate of the third transistor T3 and a first electrode (i.e., the second node N2) of the third transistor T3. Based on the first and second parasitic capacitors, a range of the data voltage VD may increase.

The pixel PX2 according to an embodiment may extend a range of a data voltage, which is reduced for a small area and a high resolution, by using the first and second parasitic capacitors and the storage capacitor. Therefore, the display apparatus 100 may easily control the brightness of pixels.

In an embodiment, a size of the second transistor T2 and a size of the third transistor T3 may differ. A size of the second transistor T2 may be less than that of the third transistor T3. Due to a size difference between transistors, effects of parasitic capacitors may differ. Due to a size difference between transistors, an effect of the second parasitic capacitor may be greater than an effect of the first parasitic capacitor. Therefore, a range of a data voltage corresponding to a range of the amount of current flowing in a pixel may increase. That is, a variation range of the data voltage VD corresponding to a variation range of the driving current ID may extend. The brightness or luminance of pixels may be easily controlled by using a data voltage.

In the pixel PX2 according to an embodiment, the fourth transistor T4 and the fifth transistor T5 may independently operate. The scan driver 113 may independently control the fourth transistor T4 and the fifth transistor T5. A gate of the fourth transistor T4 may be connected with the first emission control line EL1, and a gate of the fifth transistor T5 may be connected with the second emission control line EL2. The fourth transistor T4 may operate in response to the first emission control signal E1, and the fifth transistor T5 may operate in response to the second emission control signal E2, which differs from the first emission control signal E1. The scan driver 113 may independently control the first emission control signal E1 and the second emission control signal E2. Therefore, the display apparatus 100 according to an embodiment may control an emission time to implement PWM. A more detailed description of PWM will be described with reference to FIGS. 17A to 17C.

In the pixel PX2 according to an embodiment, the sixth transistor T6 may supply the read-out signal RO to the read-out circuit (114 of FIG. 1). In response to the read-out/initialization control signal R having an active level, the pixel PX2 may output the read-out signal RO to the read-out line ROL. That is, the pixel PX2 may perform a read-out operation in a read-out period.

The pixel PX2 of FIG. 12, like the pixel PX1 of FIG. 2, may include six transistors. Based on a reduction in the number of transistors per pixel, a pixel size may decrease.

Accordingly, a display apparatus having a small area and a high resolution may be provided.

As described above, the display apparatus 100 according to an embodiment may extend a range of a data voltage and may easily control the brightness of pixels. The display apparatus 100 may control dimming of the PAM scheme and the PWM scheme and may enhance brightness expression (or a gray level). The display apparatus 100 may measure the driving current, the threshold voltage, or the forward voltage through a secured DFT path in a wafer or package state and may implement DFT.

Figure 13:
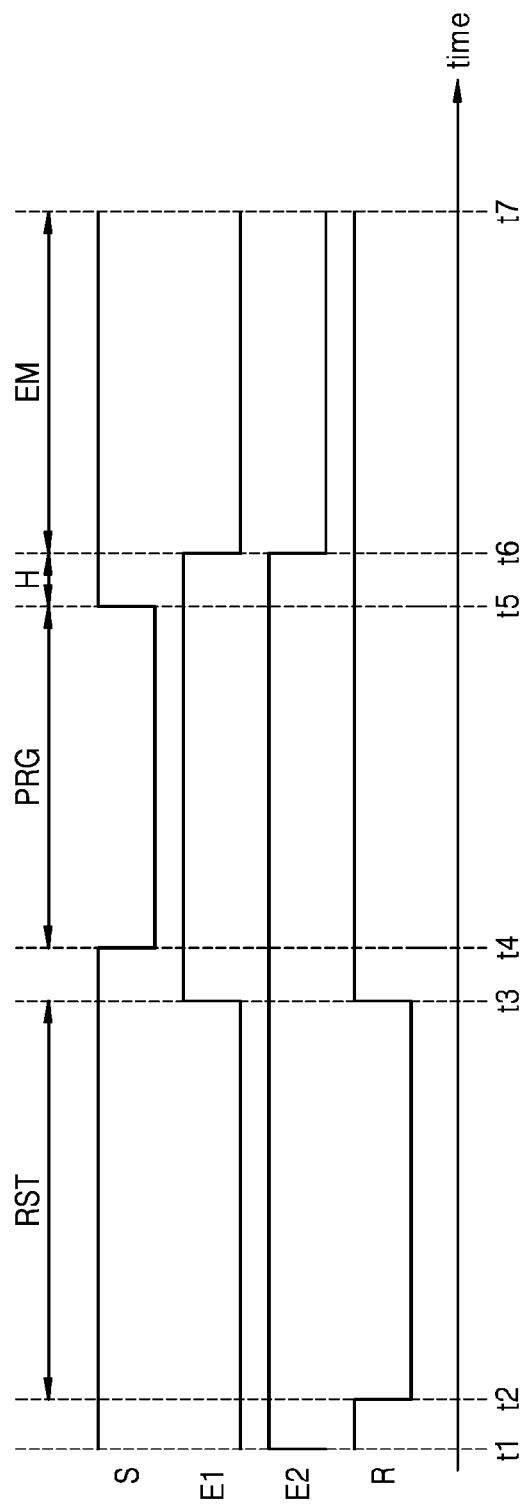
FIG. 13 is a timing diagram showing a plurality of signals for controlling a pixel, according to an embodiment.

FIG. 13 is a timing diagram showing a plurality of signals for controlling a pixel, according to an embodiment. FIGS. 14A to 14D are diagrams for describing an operation of a pixel according to an embodiment. A plurality of signals may be supplied to the pixel PX2 of FIG. 12 and will be described in conjunction with FIG. 12.

The scan driver 113 may supply the plurality of control signals to the display panel 120 through the plurality of control lines. The scan driver 113 may control the pixel PX2 by using the plurality of control signals.

A scan signal S may be logic high up to a fourth time t4 from a first time t1, the scan signal S may be logic low up to a fifth time t5 from the fourth time t4, and the scan signal S may be logic high after the fifth time t5. The scan signal S may be shifted from a logic high level to a logic low level at the fourth time t4, and the scan signal S may be shifted from a logic low level to a logic high level at the fifth time t5.

A first emission control signal E1 may be logic low up to a third time t3 from the first time t1, the first emission control signal E1 may be logic high up to a sixth time t6 from the third time t3, and the first emission control signal E1 may be logic low after the sixth time t6. The first emission control signal E1 may be shifted from a logic low level to a logic high level at the third time t3, and the first emission control signal E1 may be shifted from a logic high level to a logic low level at the sixth time t6.

A second emission control signal E2 may be logic high up to the sixth time t6 from the first time t1, and the second emission control signal E2 may be logic low after the sixth time t6. The second emission control signal E2 may be shifted from a logic low level to a logic high level at the first time t1. The second emission control signal E2 may be shifted from a logic high level to a logic low level at the sixth time t6.

A read-out/initialization control signal R may be logic high up to a second time t2 from the first time t1, the read-out/initialization control signal R may be logic low up to the third time t3 from the second time t2, and the read-out/initialization control signal R may be logic high after the third time t3. The read-out/initialization control signal R may be shifted from a logic high level to a logic low level at the second time t2, and the read-out/initialization control signal R may be shifted from a logic low level to a logic high level at the third time t3.

A reset period RST may be up to the third time t3 from the second time t2, a program period PRG may be up to the fifth time t5 from the fourth time t4, a hold period H may be up to the sixth time t6 from the fifth time t5, and an emission period EM may be up to a seventh time t7 from the sixth time t6.

Figure 14A:
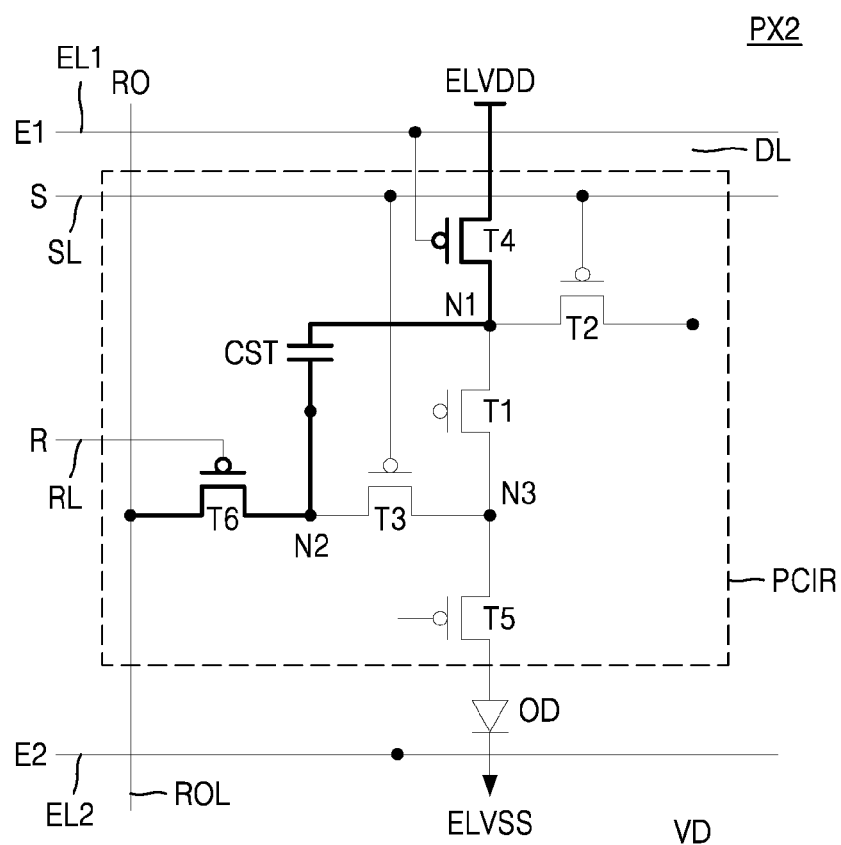
FIGS. 14A to 14D are diagrams for describing an operation of a pixel according to some embodiments.

Referring to FIGS. 13 and 14A, in the reset period RST, the scan signal S may be logic high, the first emission control signal E1 may be logic low, the second emission control signal E2 may be logic high, and the read-out/initialization control signal R may be logic low. In other words, in the reset period RST, the scan driver 113 may output the scan signal S having an inactive level through the scan line SL, output the first emission control signal E1 having an active level through the first emission control line EL1, output the second emission control signal E2 having an inactive level through the second emission control line EL2, and output the read-out/initialization control signal R having an active level through the read-out/initialization control line RL. Therefore, in the reset period RST, the second transistor T2, the third transistor T3, and the fifth transistor T5 may be turned off, and the fourth transistor T4 and the sixth transistor T6 may be turned on based on the scan signal S, the first emission control signal E1, the second emission control signal E2, and the read-out/initialization control signal R.

In response to the scan signal S having an inactive level, the second transistor T2 may be turned off. The second transistor T2 may be turned off and may cut off an electrical connection between the data line DL and the first node N1. In response to the scan signal S having an inactive level, the third transistor T3 may be turned off. The third transistor T3 may be turned off and may cut off an electrical connection between the second node N2 and the third node N3. In response to the second emission control signal E2 having an inactive level, the fifth transistor T5 may be turned off. The fifth transistor T5 may be turned off and may cut off an electrical connection between the third node N3 and the OLED OD.

In response to the first emission control signal E1 having an active level, the fourth transistor T4 may be turned on. The fourth transistor T4 may be turned on and may supply a voltage of the first driving power source ELVDD to the first node N1. In response to the read-out/initialization control signal R having an active level, the sixth transistor T6 may be turned on. The sixth transistor T6 may be turned on and may transfer a voltage of the initialization power source VINT, supplied through the read-out line ROL, to the second node N2. That is, a voltage at a gate of the first transistor T1 may be initialized to a voltage of the initialization power source VINT.

The storage capacitor CST may be charged with a voltage which is obtained as a voltage of the first driving power source ELVDD decreases by a voltage of the initialization power source VINT. That is, the storage capacitor CST may store a difference voltage between a voltage of the first driving power source ELVDD and a voltage of the initialization power source VINT.

In the pixel PX1 of FIG. 2, in the reset period RST, a static current may flow from the data line DL to the read-out line ROL. However, in the pixel PX2 of FIG. 12, in the reset period RST, a static current may not flow from the data line DL to the read-out line ROL, and thus, power consumption may be reduced.

Figure 14B:
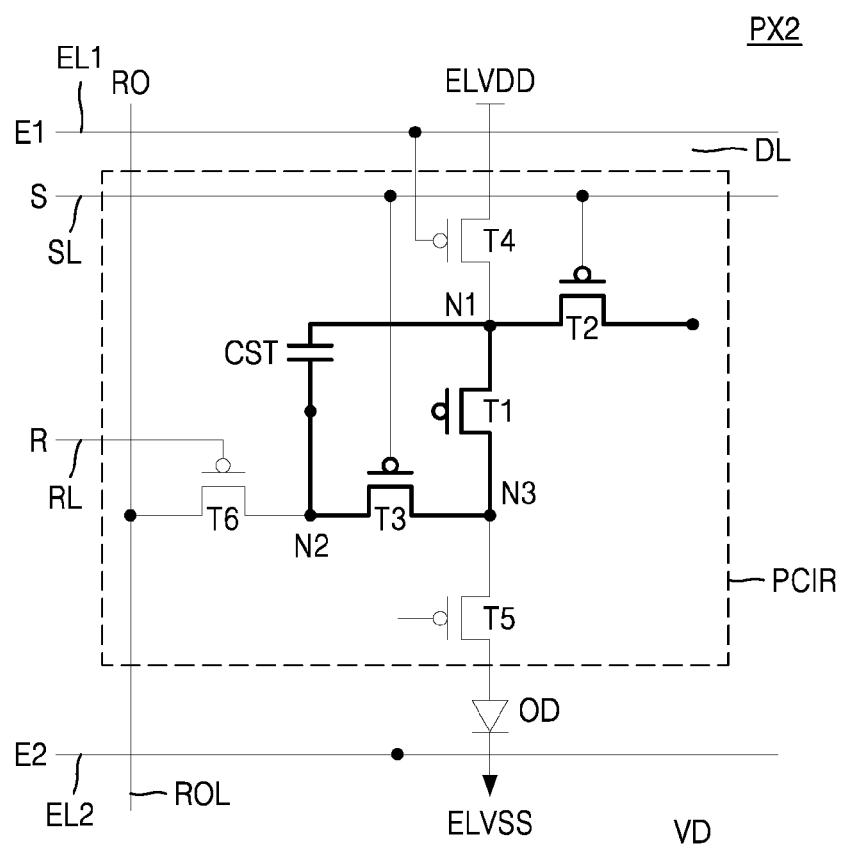

Referring to FIGS. 13 and 14B, in a program period PRG, the scan signal S may be logic low, the first emission control signal E1 may be logic high, the second emission control signal E2 may be logic high, and the read-out/initialization control signal R may be logic high. In other words, in the program period PRG, the scan driver 113 may output the scan signal S having an active level through the scan line SL, output the first emission control signal E1 having an inactive level through the first emission control line EL1, output the second emission control signal E2 having an inactive level through the second emission control line EL2, and output the read-out/initialization control signal R having an inactive level through the read-out/initialization control line RL.

In the program period PRG, the fourth transistor T4, the fifth transistor T5, and the sixth transistor T6 may be turned off and the second transistor T2 and the third transistor T3 may be turned on based on the scan signal S, the first emission control signal E1, the second emission control signal E2, and the read-out/initialization control signal R.

In response to the first emission control signal E1 having an inactive level, the fourth transistor T4 may be turned off. The fourth transistor T4 may be turned off and may cut off an electrical connection between the first driving power source ELVDD and the first node N1. In response to the second emission control signal E2 having an inactive level, the fifth transistor T5 may be turned off. The fifth transistor T5 may be turned off and may cut off an electrical connection between the third node N3 and the OLED OD. In response to the read-out/initialization control signal R having an inactive level, the sixth transistor T6 may be turned off. The sixth transistor T6 may be turned off and may cut off an electrical connection between the read-out line ROL and the second node N2.

In response to the scan signal S having an active level, the second transistor T2 may be turned on. The second transistor T2 may be turned on and may transfer a data voltage VD, supplied through the data line DL, to the first node N1. In response to the scan signal S having an active level, the third transistor T3 may be turned on. The third transistor T3 may be turned on and may connect the second node N2 with the third node N3 to provide a diode connection of the first transistor T1.

The data voltage VD may be applied to the first node N1, and a voltage, which is obtained as the data voltage VD decreases by an absolute value of a threshold voltage VTH, may be applied to the second node N2. The storage capacitor CST may be charged by the threshold voltage VTH. That is, the storage capacitor CST may store the threshold voltage VTH.

Figure 14C:
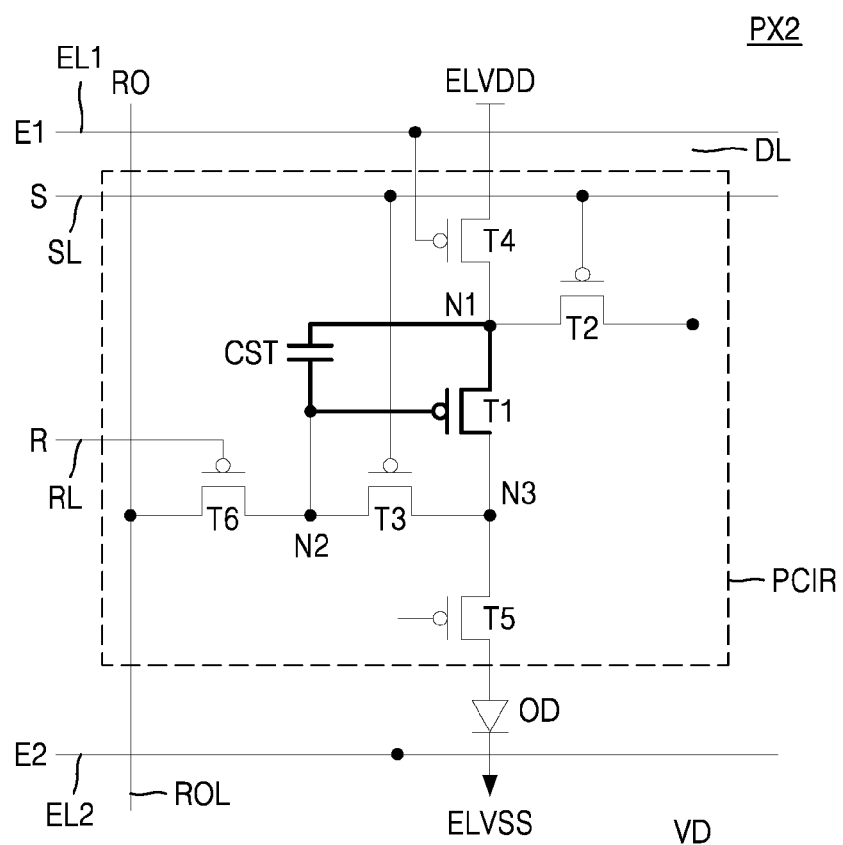

Referring to FIGS. 13 and 14C, in a hold period H, the scan signal S may be logic high, the first emission control signal E1 may be logic high, the second emission control signal E2 may be logic high, and the read-out/initialization control signal R may be logic high. In other words, in the hold period H, the scan driver 113 may output the scan signal S having an inactive level through the scan line SL, output the first emission control signal E1 having an inactive level through the first emission control line EL1, output the second emission control signal E2 having an inactive level through the second emission control line EL2, and output the read-out/initialization control signal R having an inactive level through the read-out/initialization control line RL.

In the hold period H, the second transistor T2, the third transistor T3, the fourth transistor T4, the fifth transistor T5, and the sixth transistor T6 may be turned off based on the scan signal S, the first emission control signal E1, the second emission control signal E2, and the read-out/initialization control signal R.

In response to the scan signal S having an inactive level, the second transistor T2 may be turned off. The second transistor T2 may be turned off and may cut off an electrical connection between the data line DL and the first node N1. In response to the scan signal S having an inactive level, the third transistor T3 may be turned off. The third transistor T3 may be turned off and may cut off an electrical connection between the second node N2 and the third node N3. In response to the first emission control signal E1 having an inactive level, the fourth transistor T4 may be turned off. The fourth transistor T4 may be turned off and may cut off an electrical connection between the first driving power source ELVDD and the first node N1. In response to the second emission control signal E2 having an inactive level, the fifth transistor T5 may be turned off. The fifth transistor T5 may be turned off and may cut off an electrical connection between the third node N3 and the OLED OD. In response to the read-out/initialization control signal R having an inactive level, the sixth transistor T6 may be turned off. The sixth transistor T6 may be turned off and may cut off an electrical connection between the read-out line ROL and the second node N2.

In an embodiment, like the pixel PX1 of FIG. 2, in the pixel PX2 of FIG. 12, a range of a data voltage may extend due to an influence of a parasitic capacitor. A first parasitic capacitor (not shown) may be provided between the gate electrode of the second transistor T2 and the second electrode (i.e., the first node N1) of the second transistor T2. A second parasitic capacitor (not shown) may be provided between a gate electrode of the third transistor T3 and the first electrode (i.e., the second node N2) of the third transistor T3.

In the pixel PX2, a range of a data voltage may extend due to an influence of a first parasitic capacitor and a second parasitic capacitor. In an embodiment, a size (or a magnitude) of the second transistor T2 and a size of the third transistor T3 may differ. A size of the second transistor T2 may be less than that of the third transistor T3. Due to a size difference between transistors, effects of parasitic capacitors may differ. Due to a size difference between transistors, an effect of the second parasitic capacitor may be greater than an effect of the first parasitic capacitor. Therefore, a range of a data voltage corresponding to a range of the amount of current flowing in a pixel may increase. That is, a variation range of the data voltage VD corresponding to a variation range of the driving current ID may extend. The brightness or luminance of pixels may be easily controlled by using a data voltage.

Figure 14D:
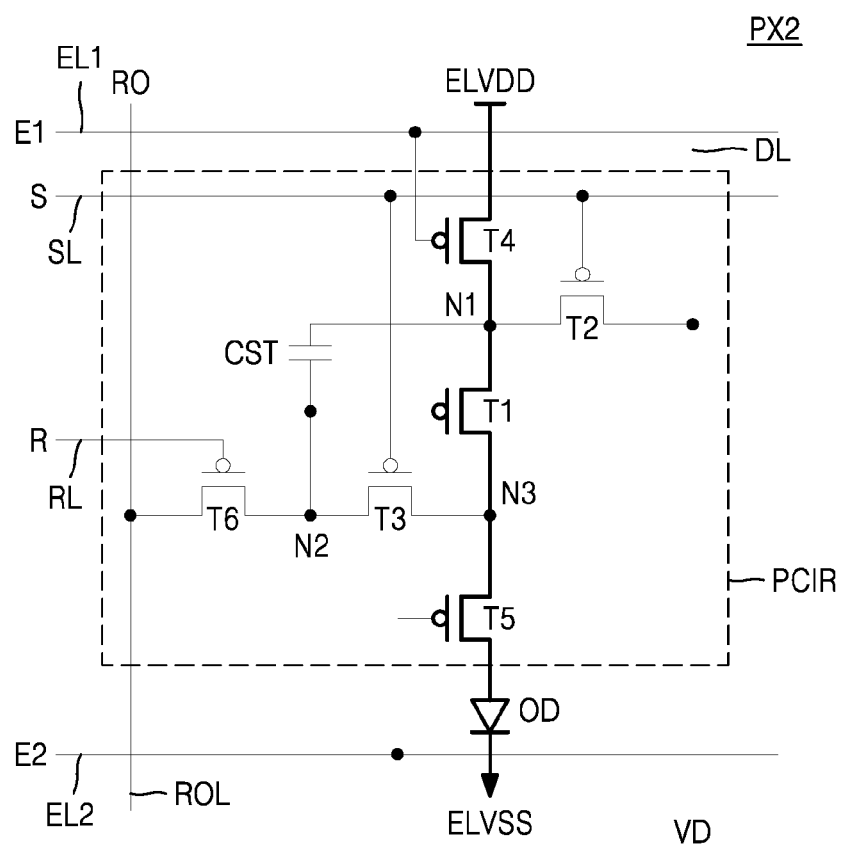

Referring to FIGS. 13 and 14D, in an emission period EM, the scan signal S may be logic high, the first emission control signal E1 may be logic low, the second emission control signal E2 may be logic low, and the read-out/initialization control signal R may be logic high. In other words, in the emission period EM, the scan driver 113 may output the scan signal S having an inactive level through the scan line SL, output the first emission control signal E1 having an active level through the first emission control line EL1, output the second emission control signal E2 having an active level through the second emission control line EL2, and output the read-out/initialization control signal R having an inactive level through the read-out/initialization control line RL. In the emission period EM, the second transistor T2, the third transistor T3, and the sixth transistor T6 may be turned off, and the fourth transistor T4 and the fifth transistor T5 may be turned on based on the scan signal S, the first emission control signal E1, the second emission control signal E2, and the read-out/initialization control signal R.

In response to the scan signal S having an inactive level, the second transistor T2 may be turned off. The second transistor T2 may be turned off and may cut off an electrical connection between the data line DL and the first node N1. In response to the scan signal S having an inactive level, the third transistor T3 may be turned off. The third transistor T3 may be turned off and may cut off an electrical connection between the second node N2 and the third node N3. In response to the read-out/initialization control signal R having an inactive level, the sixth transistor T6 may be turned off. The sixth transistor T6 may be turned off and may cut off an electrical connection between the read-out line ROL and the second node N2.

In response to the first emission control signal E1 having an active level, the fourth transistor T4 may be turned on. In response to the second emission control signal E2 having an active level, the fifth transistor T5 may be turned on. The fourth and fifth transistors T4 and T5 may all be turned on, and the first transistor T1 may transfer the driving current ID to the OLED OD such that the driving current ID corresponding to the data voltage VD may flow in the OLED OD.

Figure 15:
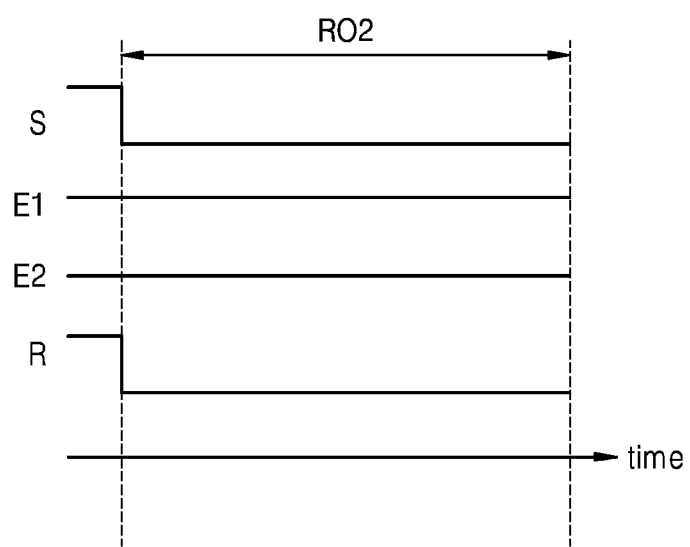
FIG. 15 is a timing diagram showing a plurality of signals for controlling a pixel, according to an embodiment.
Figure 16:
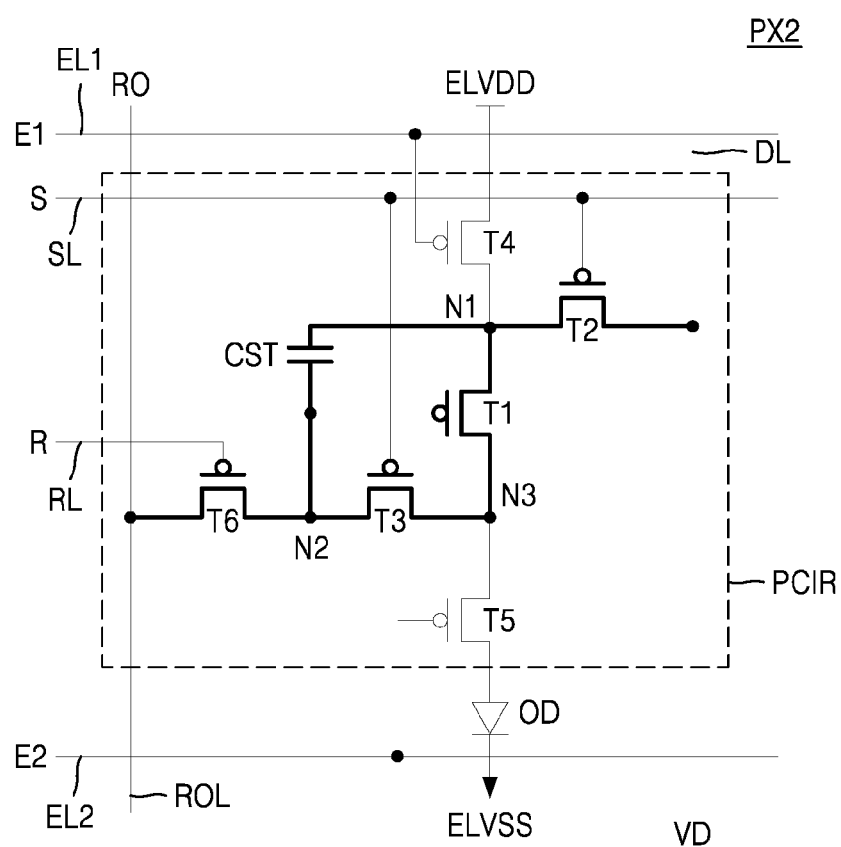
FIG. 16 is a diagram for describing an operation of a pixel according to an embodiment.

FIG. 15 is a timing diagram showing a plurality of signals for controlling a pixel, according to an embodiment. FIG. 16 is a diagram for describing an operation of a pixel PX2 according to an embodiment. A plurality of signals may be supplied to the pixel PX2 of FIG. 12 and will be described in conjunction with FIGS. 1 and 12.

In a read-out period, the pixel PX2 may output a read-out signal RO through a read-out line ROL. In a second read-out period RO2, the read-out circuit 114 may detect a threshold voltage VTH. After a reset period RST, the display apparatus 100 may perform a second read-out operation instead of a program operation. The second read-out operation may denote an operation of detecting the threshold voltage VTH. The display apparatus 100 may perform the second read-out operation in the second read-out period RO2. In the second read-out period RO2, the pixel PX2 may output an output voltage VO to the read-out circuit 114. The output voltage VO, as described above with reference to FIG. 8, may denote a voltage which is obtained as a data voltage VD decreases by the threshold voltage VTH.

A method of measuring the threshold voltage VTH will be described with reference to FIGS. 15 and 16. Referring to FIGS. 12, 15, and 16, in the second read-out period RO2, the scan signal S may be logic low, the first emission control signal E1 may be logic high, the second emission control signal E2 may be logic high, and the read-out/initialization control signal R may be logic low. In other words, in the second read-out period RO2, the scan driver 113 may output the scan signal S having an active level through the scan line SL, output the first emission control signal E1 having an inactive level through the first emission control line EL1, output the second emission control signal E2 having an inactive level through the second emission control line EL2, and output the read-out/initialization control signal R having an active level through the read-out/initialization control line RL. In the second read-out period RO2, the fourth transistor T4 and the fifth transistor T5 may be turned off, and the second transistor T2, the third transistor T3, and the sixth transistor T6 may be turned on based on the scan signal S, the first emission control signal E1, the second emission control signal E2, and the read-out/initialization control signal R.

In response to the scan signal S having an active level, the second transistor T2 may be turned on. In response to the scan signal S having an active level, the third transistor T3 may be turned on. In response to the read-out/initialization control signal R having an active level, the sixth transistor T6 may be turned on. In response to the first emission control signal E1 having an inactive level, the fourth transistor T4 may be turned off. In response to the second emission control signal E2 having an inactive level, the fifth transistor T5 may be turned off.

In response to the scan signal S having an active level, the second transistor T2 may be turned on. The second transistor T2 may be turned on and may transfer the data voltage VD, supplied through the data line DL, to the first node N1. The data voltage VD may be applied to the first node N1. A voltage, which is obtained as the data voltage VD decreases by the absolute value of the threshold voltage VTH, may be applied to the second node N2.

In response to the read-out/initialization control signal R having an active level, the sixth transistor T6 may be turned on. The sixth transistor T6 may be turned on and may electrically connect the second node N2 with the read-out line ROL. The output voltage VO may be output to the read-out line ROL.

The read-out circuit 114 may receive the output voltage VO through the read-out line ROL. The read-out circuit 114 may detect the threshold voltage VTH, based on the output voltage VO and the data voltage VD. The read-out circuit 114 may analog-to-digital convert the threshold voltage VTH to generate read-out data.

The pixel PX2 of FIG. 16, like the pixel PX1 of FIG. 2, may include six transistors. The sixth transistor T6 may be turned on in the reset period RST and the second read-out period RO2. That is, the sixth transistor T6 may control an initialization operation and a second read-out operation. The sixth transistor T6 may transfer a voltage of the initialization power source VINT to the second node N2 in the reset period RST. Also, the sixth transistor T6 may transfer the read-out signal RO to the read-out circuit 114 in the second read-out period RO2. The sixth transistor T6 may control all of an initialization operation and a second read-out operation, and thus, the number of transistors may be reduced. Based on a reduction in the number of transistors per pixel, a pixel size may decrease. Accordingly, a display apparatus having a small area and a high resolution may be provided.

The second electrode of the sixth transistor T6 of the pixel PX1 of FIG. 2 may be connected with the third node N3. Therefore, the display apparatus 100 including the pixel PX1 may perform first to third read-out operations. The display apparatus 100 including the pixel PX1 may measure the driving current ID, the threshold voltage VTH, and the forward voltage VF of the pixel PX1.

On the other hand, the second electrode of the sixth transistor T6 of the pixel PX2 of FIG. 16 may be connected with the second node N2. Therefore, the display apparatus 100 including the pixel PX2 may perform only the second read-out operation of a plurality of read-out operations. The display apparatus 100 including the pixel PX2 may measure only the threshold voltage VTH of the pixel PX2.

Figure 17A:
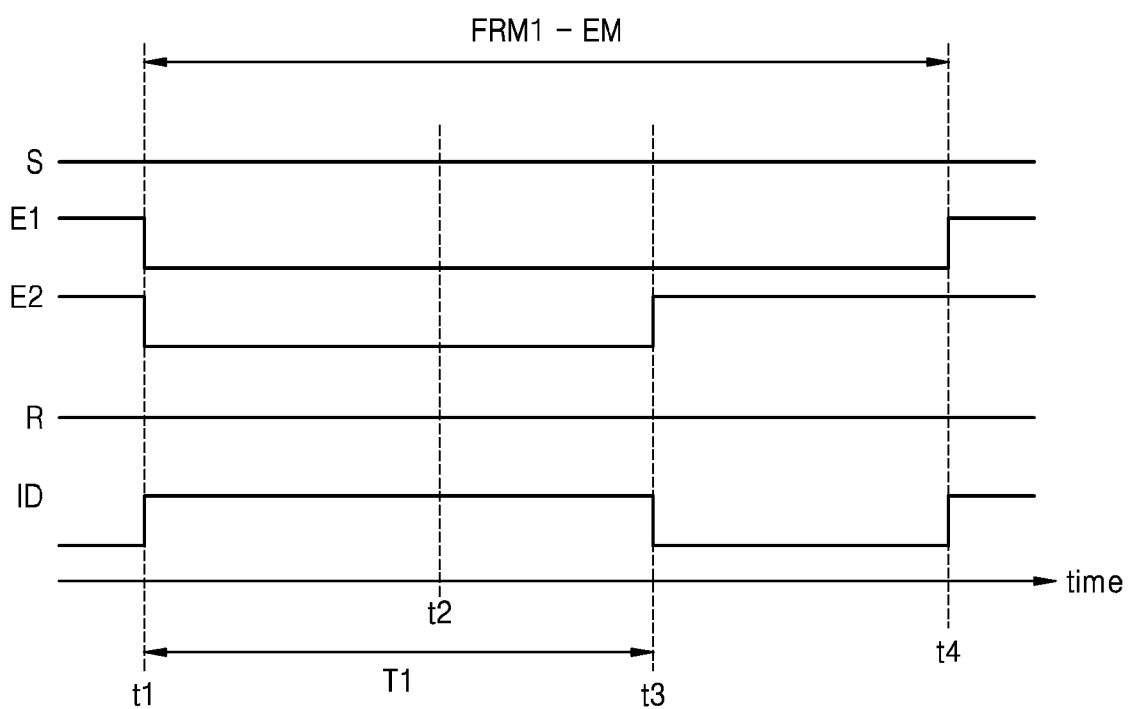
FIGS. 17A to 17C are timing diagrams showing a plurality of signals for controlling a pixel, according to some embodiments.
Figure 17B:
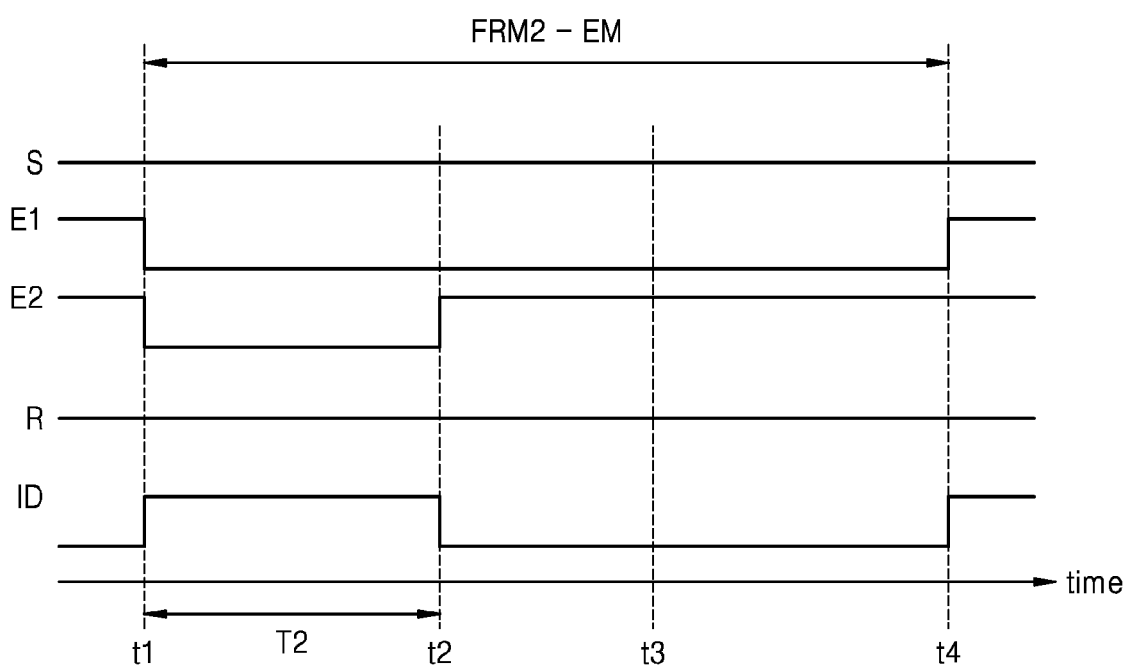
Figure 17C:
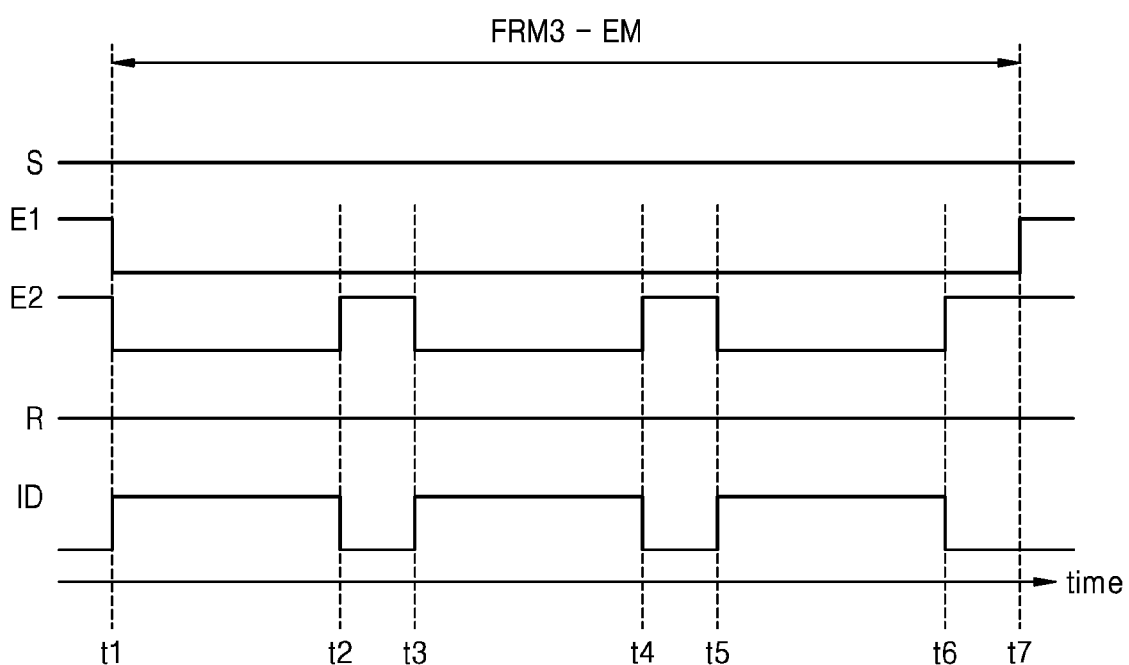

FIGS. 17A to 17C are timing diagrams showing a plurality of signals for controlling a pixel, according to an embodiment.

Referring to FIGS. 6 and 13, the second emission control signal E2 may maintain a logic low level during the emission period EM. On the other hand, referring to FIGS. 17A to 17C, the second emission control signal E2 may be a period which is logic high during the emission period EM.

A pixel PX (for example, the pixel PX1 of FIG. 2 and/or the pixel PX2 of FIG. 12) according to an embodiment may control the luminance of the OLED OD by using the second emission control signal E2. The pixel PX may control an emission time of the OLED OD, based on the second emission control signal E2, and thus, brightness expression (or a gray level) may be enhanced.

FIG. 17A shows an emission period EM of a first frame FRM1, FIG. 17B shows an emission period EM of a second frame FRM2, and FIG. 17C shows an emission period EM of a third frame FRM3. It may be assumed that the luminance of the first frame FRM1 is higher than that of the second frame FRM2.

Referring to FIGS. 1, 2, 12, and 17A, up to a fourth time t4 from a first time t1, the scan signal S may be logic high, the first emission control signal E1 may be logic low, and the read-out/initialization control signal R may be logic high.

The second emission control signal E2 may be logic low up to a third time t3 from the first time t1, and the second emission control signal E2 may be logic high up to the fourth time t4 from the third time t3. The second emission control signal E2 may have an active level for a first time T1.

In other words, in the emission period EM, the scan driver 113 may output the scan signal S having an inactive level through the scan line SL, output the first emission control signal E1 having an active level through the first emission control line EL1, and output the read-out/initialization control signal R having an inactive level through the read-out/initialization control line RL. The scan driver 113 may output the second emission control signal E2 having an active level through the second emission control line EL2 up to the third time t3 from the first time t1 in the emission period EM and may output the second emission control signal E2 having an inactive level through the second emission control line EL2 up to the fourth time t4 from the third time t3 in the emission period EM.

During the emission period EM, the fourth transistor T4 may be turned on in response to the first emission control signal E1 having an active level. Up to the third time t3 from the first time t1, the fifth transistor T5 may be turned on in response to the second emission control signal E2 having an active level. Up to the fourth time t4 from the third time t3, the fifth transistor T5 may be turned off in response to the second emission control signal E2 having an inactive level. The driving current ID may be supplied to the OLED OD up to the third time t3 from the first time t1. The supply of the driving current ID to the OLED OD may be cut off up to the fourth time t4 from the third time t3.

Referring to FIGS. 1, 2, 12, and 17B, up to a fourth time t4 from a first time t1, the scan signal S may be logic high, the first emission control signal E1 may be logic low, and the read-out/initialization control signal R may be logic high.

The second emission control signal E2 may be logic low up to a second time t2 from the first time t1, and the second emission control signal E2 may be logic high up to the fourth time t4 from the second time t2. The second emission control signal E2 may have an active level for a second time T1. The second time T2 may be shorter than the first time T1.

During the emission period EM, the fourth transistor T4 may be turned on in response to the first emission control signal E1 having an active level. Up to the second time t2 from the first time t1, the fifth transistor T5 may be turned on in response to the second emission control signal E2 having an active level. Up to the fourth time t4 from the second time t2, the fifth transistor T5 may be turned off in response to the second emission control signal E2 having an inactive level. The driving current ID may be supplied to the OLED OD up to the second time t2 from the first time t1. The supply of the driving current ID to the OLED OD may be cut off up to the fourth time t4 from the second time t2.

The first time T1 (FIG. 17A) may be longer than the second time T2 (FIG. 17B). That is, during the emission period EM, a time (i.e., the first time T1) for which the driving current ID flows in the first frame FRM1 may be longer than a time (i.e., the second time T2) for which the driving current ID flows in the second frame FRM2. Therefore, even when the same data voltage VD is applied in the first frame FRM1 and the second frame FRM2, a light signal having luminance which is higher in the first frame FRM1 than the second frame FRM2 may be output.

The scan driver 113 may control a time of a period where the second emission control signal E2 has an active level, based on predetermined luminance. During the emission period EM, the second emission control signal E2 may vary at every frame. For example, when predetermined luminance of the first frame FRM1 differs from predetermined luminance of the second frame FRM2, a time (i.e., the first time T1) for which a second emission control signal E2 for the first frame FRM1 has an active level may differ from a time (i.e., the second time T2) for which a second emission control signal E2 for the second frame FRM2 has an active level. The second emission control signal E2 may vary based on luminance which is set for each frame, and thus, a time (for example, a dimming time) for which the driving current ID flows may be controlled. The pixel PX may output a light signal having luminance based on a dimming time and intensity of the driving current ID. The brightness of the OLED OD may be controlled based on a voltage (i.e., a data voltage VD) of the data line DL and a time of a period where the second emission control signal E2 has an active level.

Referring to FIGS. 1, 2, 12, and 17C, up to a seventh time t7 from a first time t1, the scan signal S may be logic high, the first emission control signal E1 may be logic low, and the read-out/initialization control signal R may be logic high.

The second emission control signal E2 may be logic low up to a second time t2 from the first time t1, the second emission control signal E2 may be logic high up to a third time t3 from the second time t2, the second emission control signal E2 may be logic low up to a fourth time t4 from the third time t3, the second emission control signal E2 may be logic high up to a fifth time t5 from the fourth time t4, the second emission control signal E2 may be logic low up to a sixth time t6 from the fifth time t5, and the second emission control signal E2 may be logic high after the sixth time t6.

During the emission period EM, the fourth transistor T4 may be turned on in response to the first emission control signal E1 having an active level. Up to the second time t2 from the first time t1, the fifth transistor T5 may be turned on in response to the second emission control signal E2 having an active level. Up to the third time t3 from the second time t2, the fifth transistor T5 may be turned off in response to the second emission control signal E2 having an inactive level. Up to the fourth time t4 from the third time t3, the fifth transistor T5 may be turned on in response to the second emission control signal E2 having an active level. Up to the fifth time t5 from the fourth time t4, the fifth transistor T5 may be turned off in response to the second emission control signal E2 having an inactive level. Up to the sixth time t6 from the fifth time t5, the fifth transistor T5 may be turned on in response to the second emission control signal E2 having an active level. Up to the seventh time t7 from the sixth time t6, the fifth transistor T5 may be turned off in response to the second emission control signal E2 having an inactive level.

The driving current ID may be supplied to the OLED OD up to the second time t2 from the first time t1. The supply of the driving current ID to the OLED OD may be cut off up to the third time t3 from the second time t2. The driving current ID may be supplied to the OLED OD up to the fourth time t4 from the third time t3. The supply of the driving current ID to the OLED OD may be cut off up to the fifth time t5 from the fourth time t4. The driving current ID may be supplied to the OLED OD up to the sixth time t6 from the fifth time t5. The supply of the driving current ID to the OLED OD may be cut off up to the seventh time t7 from the sixth time t6.

As described above, referring to FIG. 7A, in the emission period EM, the second emission control signal E2 may have an active level for only the first time T1. On the other hand, referring to FIG. 17C, in the emission period EM, the second emission control signal E2 may have an active level for the second time t2 from the first time t1, the fourth time t4 from the third time t3, and the sixth time t6 from the fifth time t5. During the emission period EM, a logic low level and a logic high level of the second emission control signal E2 may be repeatedly shifted therebetween. The fourth and fifth transistors T4 and T5 may be independently controlled, and thus, the display apparatus 100 may implement PWM. The display apparatus 100 may control an emission time of the OLED OD, based on the second emission control signal E2. Luminance may be adjusted based on the emission time of the OLED OD. Accordingly, the display apparatus 100 according to an embodiment may enhance brightness expression (or a gray level).

Figure 18:
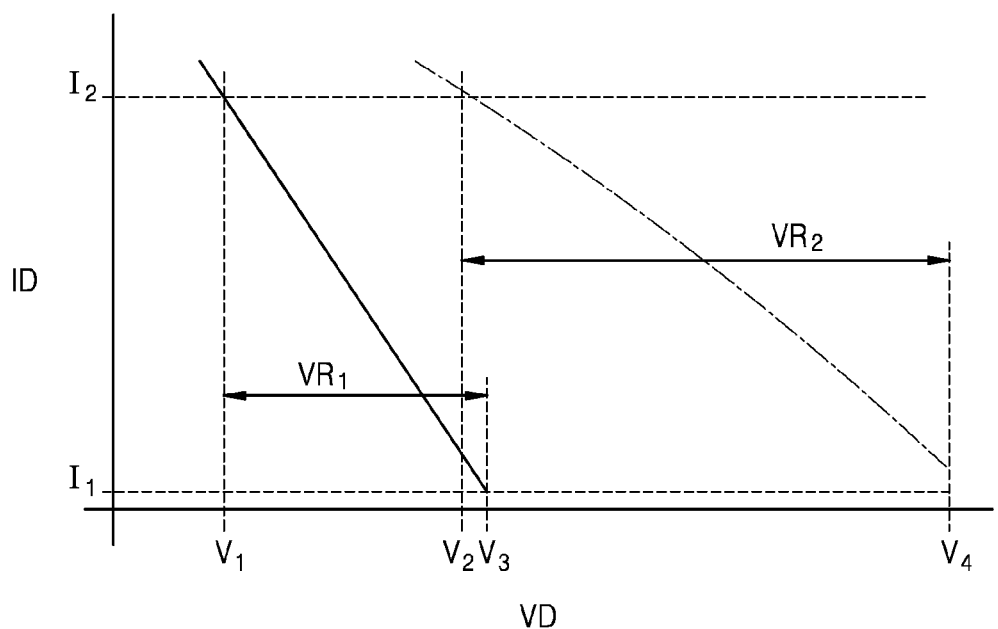
FIG. 18 is a diagram illustrating an example of variation of a driving current corresponding to a variation of a data voltage of a pixel.

FIG. 18 is a diagram illustrating an example of variation of a driving current corresponding to a variation of a data voltage of a pixel.

The abscissa axis represents a data voltage VD, and the ordinate axis represents a driving current ID. Referring to FIGS. 2, 3, 12, and 18, a solid line represents a variation of the driving current ID corresponding to a variation of the data voltage VD of the pixel PXa of FIG. 3, and a dash-single dotted line represents a variation of the driving current ID corresponding to a variation of the data voltage VD of each of the pixels PX1 and PX2 of FIGS. 2 and 12.

The OLED OD of the pixel PXa of FIG. 3 may be controlled when the driving current ID is within a range from the amount of first current I1 to the amount of second current I2. The data voltage VD corresponding to a variation of the driving current ID may include first to third voltages V1 to V3. That is, a variation range of the data voltage VD of the pixel PXa of FIG. 3 may be a first voltage range VR1.

The OLED OD of each of the pixels PX1 and PX2 of FIGS. 2 and 12 may be controlled when the driving current ID is within a range from the amount of first current I1 to the amount of second current I2. The data voltage VD corresponding to a variation of the driving current ID may include second to fourth voltages V2 to V4. That is, a variation range of the data voltage VD of each of the pixels PX1 and PX2 of FIGS. 2 and 12 may be a second voltage range VR2. The second voltage range VR2 may be greater than the first voltage range VR1.

The storage capacitor CST of the pixel PXa of FIG. 3 may be connected between the gate of the first transistor T1 and the first driving power source ELVDD. The storage capacitor CST of each of the pixels PX1 and PX2 of FIGS. 2 and 12 may be connected between the gate of the first transistor T1 and the second electrode of the fourth transistor T4 (i.e., between the first transistor T1 and the fourth transistor T4). Accordingly, a variation range of the data voltage VD corresponding to a variation range of the amount of current in the OLED OD may extend. The luminance or brightness of the OLED OD may be easily controlled by using the data voltage VD.

Figure 19:
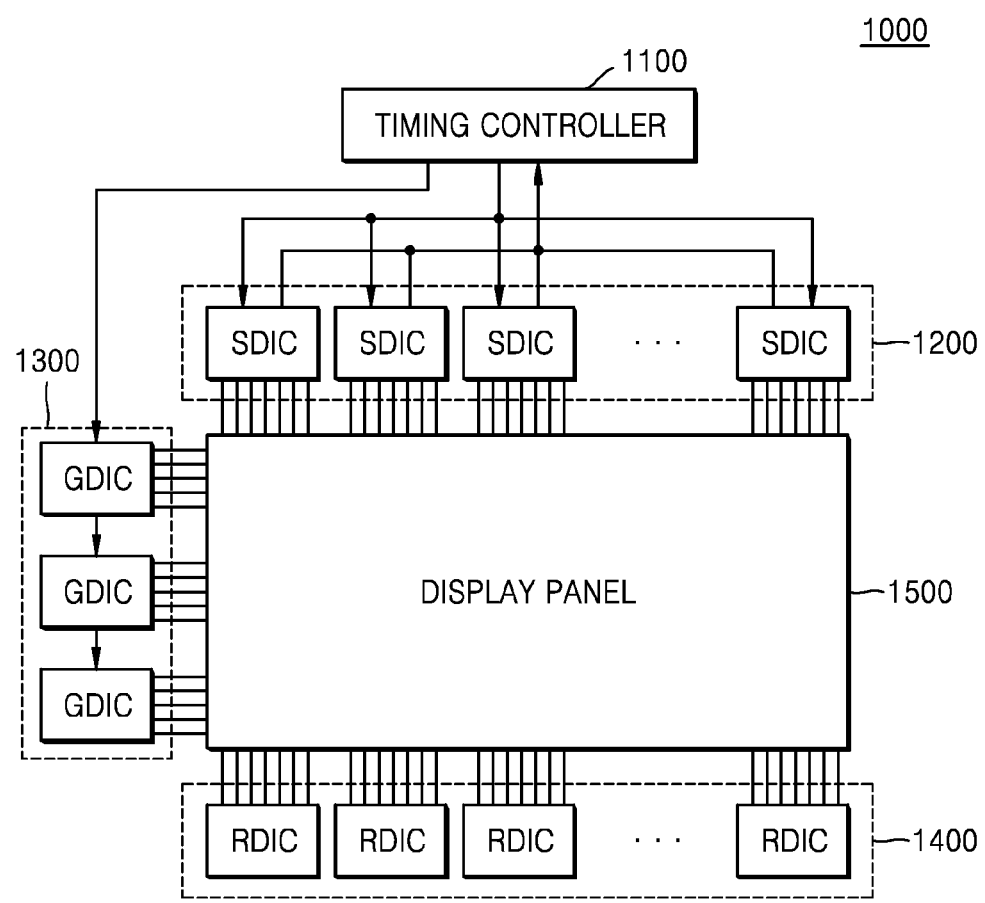
FIG. 19 illustrates a display apparatus according to an embodiment.

FIG. 19 illustrates a display apparatus 1000 according to an embodiment.

The display apparatus 1000 of FIG. 19 may be an apparatus including a medium-large display panel 1500, and for example, may be applied to TVs, monitors, etc. Referring to FIG. 19, the display apparatus 1000 may include a timing controller 1100, a source driver 1200, a gate driver 1300, a read-out circuit 1400, and the display panel 1500. The source driver 1200 may be the same as or similar to the data driver 112 of FIG. 1, the gate driver 1300 may be the same as or similar to the scan driver 113 of FIG. 1, and the timing controller 1100 may be the same as or similar to the control logic circuit 111 of FIG. 1.

The timing controller 1100 may be configured as one or more integrated circuits (ICs) or modules. The timing controller 1100 may communicate with a plurality of source driver ICs SDIC and a plurality of gate driver ICs GDIC through a predetermined interface.

The timing controller 1100 may generate control signals for controlling driving timings of the plurality of source driver ICs SDIC and the plurality of gate driver ICs GDIC and may supply the control signals to the plurality of source driver ICs SDIC and the plurality of gate driver ICs GDIC.

The source driver 1200 may include the plurality of source driver ICs SDIC, and the plurality of source driver ICs SDIC may be mounted on a circuit film such as a tape carrier package (TCP), a chip on film (COF), or a flexible printed circuit (FPC) and may be attached on the display panel 1500 in a tape automatic bonding (TAB) type or may be mounted in a non-display area of the display panel 1500 in a chip on glass (COG) type.

The gate driver 1300 may include the plurality of gate driver ICs GDIC, and the plurality of gate driver ICs GDIC may be mounted on a circuit film and may be attached on the display panel 1500 in the TAB type or may be mounted in the non-display area of the display panel 1500 in the COG type. In some embodiments, the gate driver 1300 may be directly formed on a lower substrate of the display panel 1500 in a gate-driver in panel (GIP) type. The gate driver 1300 may be provided in the non-display area outside a pixel array where pixels are provided, in the display panel 1500, and may be formed by the same TFT process as the pixels.

The read-out circuit 1400 may include a plurality of read-out ICs RDIC, and the plurality of read-out ICs RDIC may be mounted on a circuit film such as a TCP, a COF, or an FPC and may be attached on the display panel 1500 in the TAB type or may be mounted in the non-display area of the display panel 1500 in the COG type. The read-out circuit 1400, as described above with reference to FIGS. 1 to 18, may read out an electrical characteristic of each of pixels PX to generate read-out data. In FIG. 19, it is illustrated that the read-out circuit 1400 is implemented a separate chip which differs from the source driver 1200, but embodiments are not limited thereto. In some embodiments, at least one of the plurality of source driver ICs SDIC may include the read-out circuit (114 of FIG. 1) described above with reference to FIG. 1. The display panel 1500 may include the pixel PX described above with reference to FIGS. 1 to 18.

Figure 20:
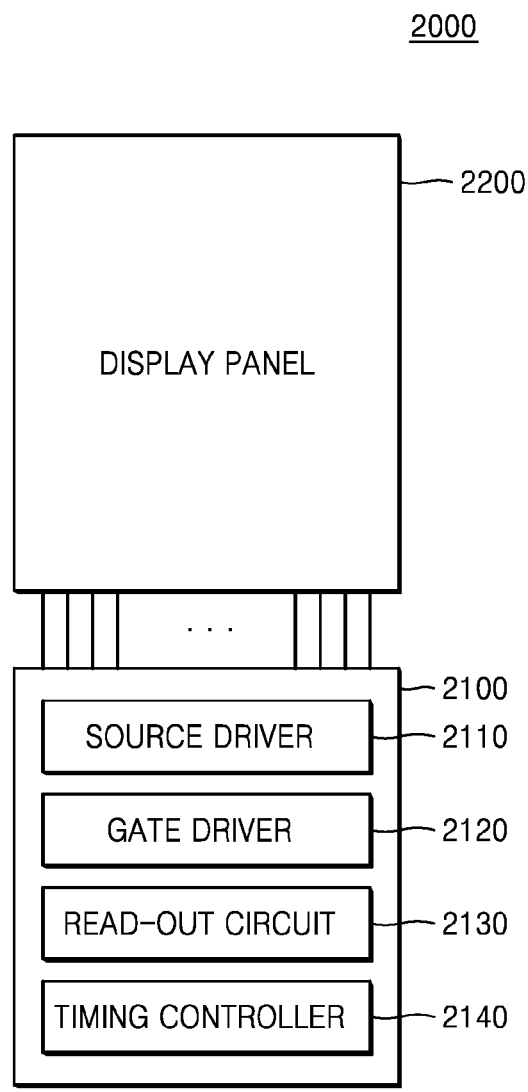
FIG. 20 illustrates a display apparatus according to an embodiment.

FIG. 20 illustrates a display apparatus 2000 according to an embodiment.

The display apparatus 2000 of FIG. 20 may be an apparatus including a small display panel 2200 (as compared to the display panel 1500 of FIG. 19, for example), and for example, may be applied to wearable devices or mobile devices such as smartphones and tablet PCs. Referring to FIG. 20, the display apparatus 2000 may include a display driving circuit 2100 and a display panel 2200. The display driving circuit 2100 may be configured with one or more ICs, and the display driving circuit 2100 may be mounted on a circuit film such as a TCP, a COF, or an FPC and may be attached on the display panel 2200 in the TAB type or may be mounted in a non-display area (for example, an area which does not display an image) of the display panel 2200 in the COG type.

The display driving circuit 2100 may include a source driver 2110, a gate driver 2120, a read-out circuit 2130, and a timing controller 2140. The source driver 2110 may be the same as or similar to the data driver 112 of FIG. 1, the gate driver 2120 may be the same as or similar to the scan driver 113 of FIG. 1, and the timing controller 2140 may be the same as or similar to the control logic circuit 111 of FIG. 1. The read-out circuit 2130, as described above with reference to FIGS. 1 to 14, may read out an electrical characteristic of each of pixels PX to generate read-out data.

The display panel 2200 may be the same as or similar to the display panel 120 of FIG. 1, and the display panel 2200 may include pixels PX each including the OLED OD described above with reference to FIGS. 1 to 18.

Figure 21:
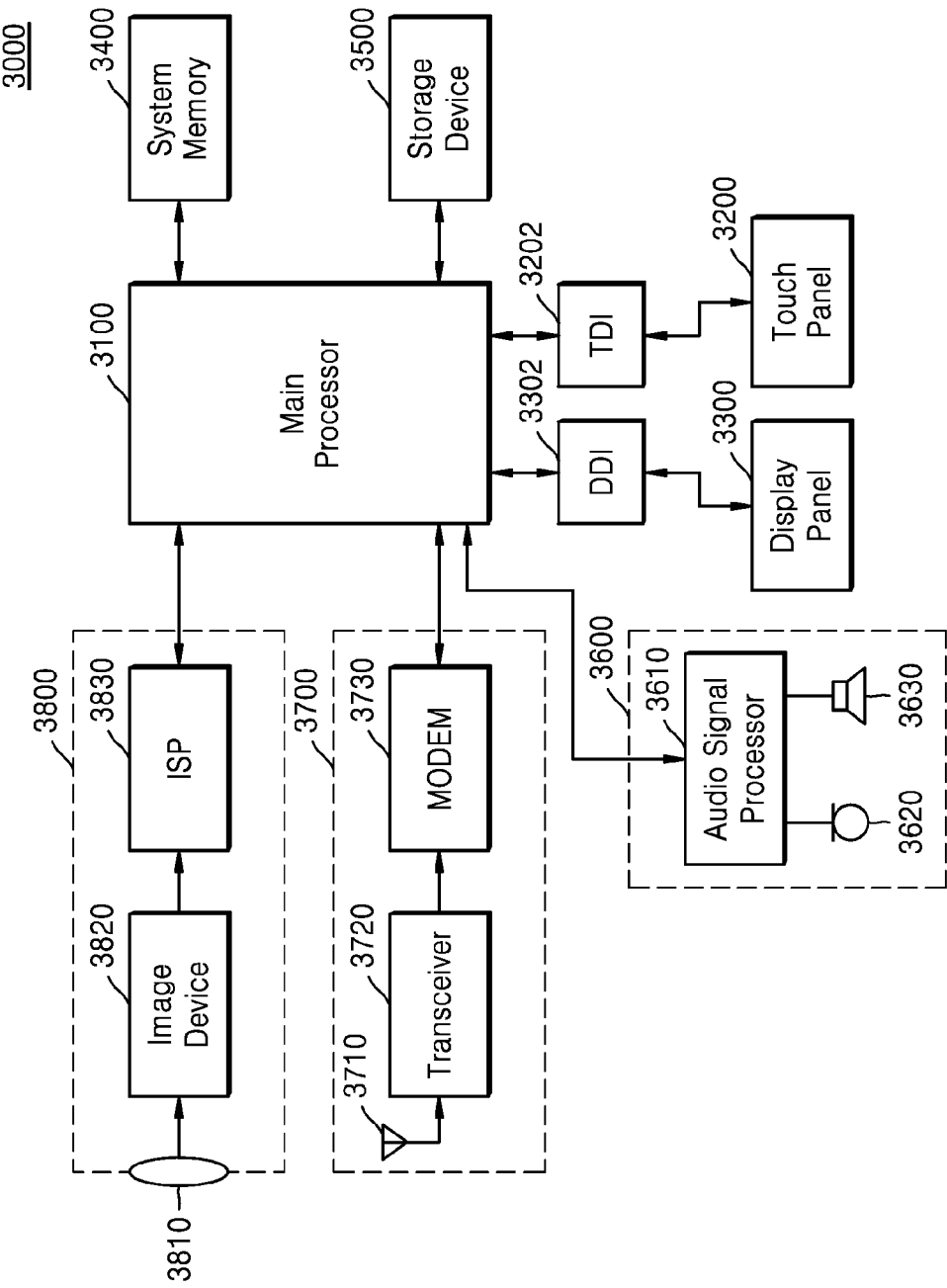
FIG. 21 is a block diagram illustrating an electronic device according to an embodiment.

FIG. 21 is a block diagram illustrating an electronic device 3000 according to an embodiment.

Referring to FIG. 21, the electronic device 3000 may include a main processor 3100, a touch panel 3200, a touch driving circuit (TDI) 3202, a display panel 3300, a display driving circuit (DDI) 3302, a system memory 3400, a storage device 3500, an audio processor 3600, a communication block 3700, and an image processor 3800. In some embodiments, the electronic device 3000 may further include a power management circuit. In an embodiment, the electronic device 3000 may be one of various electronic devices such as a mobile communication terminal, a personal digital assistant (PDA), a portable media player (PMP), a digital camera, a smartphone, a tablet computer, a lap-top computer, and a wearable device, or may be one of various communication devices, supporting radio relay, such as a wireless router and a wireless communication base station. In an embodiment, the electronic device 3000 may further include elements other than the elements illustrated in FIG. 16, or some of the elements illustrated in FIG. 15 may be omitted in the electronic device 3000.

The main processor 3100 may control overall operations of the electronic device 3000. The main processor 3100 may control/manage operations of the elements of the electronic device 3000. The main processor 3100 may perform various arithmetic operations for operating the electronic device 3000.

The touch panel 3200 may be configured to sense a touch input from a user, based on control by the touch driving circuit 3202. The display panel 3300 may be configured to display image information, based on control by the display driving circuit 3302. In an embodiment, the display panel 3300 and the display driving circuit 3302 may respectively be the display panel and the display driving circuit described above with reference to FIGS. 1 to 18. The display panel 3300 and the display driving circuit 3302 may operate based on an operating method described with reference to FIGS. 1 to 18.

The system memory 3400 may store data which is used in an operation of the electronic device 3000. For example, the system memory 3400 may include a volatile memory, such as static random access memory (RAM) (SRAM), dynamic RAM (DRAM), or synchronous DRAM (SDRAM), and/or a non-volatile memory such as phase-change RAM (PRAM), magneto-resistive RAM (MRAM), resistive RAM (ReRAM), or ferroelectric RAM (FRAM).

The storage device 3500 may store data regardless of the supply of power. For example, the storage device 3500 may include at least one of various non-volatile memories such as flash memory, PRAM, MRAM, ReRAM, and FRAM. For example, the storage device 3500 may include an internal memory and/or an attachable/detachable memory of the electronic device 3000.

The audio processor 3600 may process an audio signal by using an audio signal processor 3610. The audio processor 3600 may receive an audio input through a microphone 3620, or may supply an audio output through a speaker 3630.

The communication block 3700 may exchange a signal with an external device/system through an antenna 3710. A transceiver 3720 and a modulator/demodulator (MODEM) 1730 of the communication block 3700 may exchange the signal with the external device/system according to at least one of various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 3800 may receive light through a lens 3810. An image device 3820 and an image signal processor 3830 each included in the image processor 3800 may generate image information about an external object, based on the received light.

Hereinabove, exemplary embodiments have been described in the drawings and the specification. Embodiments have been described by using the terms described herein, but these terms have been merely used for describing the embodiments and have not been used for limiting a meaning or limiting the scope of the following claims. Therefore, it may be understood by those of ordinary skill in the art that various modifications and other equivalent embodiments may be implemented from the present disclosure. Accordingly, the spirit and scope of the present disclosure may be defined based on the spirit and scope of the following claims.

While various embodiments have been particularly shown and described with reference to the drawings, it will be understood that various changes in form and details may be made therein without departing from the spirit and scope of the following claims.

What is claimed is:

1. A display apparatus comprising:
    a plurality of pixels arranged in rows and columns;
    a scan driver connected with the rows of pixels through a scan line, a first emission control line, a second emission control line, and a read-out/initialization control line;
    a data driver connected with the columns of pixels through a data line; and
    a read-out circuit connected with the columns of pixels through a read-out line and configured to read out an electrical characteristic of each of the plurality of pixels,
    wherein each of the plurality of pixels comprises:
        a first transistor including a first electrode connected with a first node, a second electrode connected with a third node, and a gate connected with a second node;
        a second transistor including a first electrode connected with the data line, a second electrode connected with the first node, and a gate connected with the scan line;
        a third transistor including a first electrode connected with the second node, a second electrode connected with the third node, and a gate connected with the scan line;
        a fourth transistor including a first electrode connected with a power node to which a source voltage is supplied, a second electrode connected with the first node, and a gate connected with the first emission control line;

a fifth transistor including a first electrode, a second electrode, and a gate, the first electrode of the fifth transistor being connected with the third node and the gate of the fifth transistor being connected with the second emission control line;

a sixth transistor including a first electrode connected with the read-out line, a second electrode connected with the third node, and a gate connected with the read-out/initialization control line;

a capacitor connected between the first node and the second node; and an organic light-emitting diode connected between the second electrode of the fifth transistor and a ground node to which a ground voltage is supplied.

2. The display apparatus of claim 1, wherein the scan driver is configured to, in a reset period, output a scan signal having an active level through the scan line, output a first emission control signal having an inactive level through the first emission control line, output a second emission control signal having an inactive level through the second emission control line, and output a read-out/initialization control signal having an active level through the read-out/initialization control line.

3. The display apparatus of claim 1, wherein the scan driver is configured to, in a program period, output a scan signal having an active level through the scan line, output a first emission control signal having an inactive level through the first emission control line, output a second emission control signal having an inactive level through the second emission control line, and output a read-out/initialization control signal having an inactive level through the read-out/initialization control line.

4. The display apparatus of claim 1, wherein the scan driver is configured to, in a hold period, output a scan signal having an inactive level through the scan line, output a first emission control signal having an inactive level through the first emission control line, output a second emission control signal having an inactive level through the second emission control line, and output a read-out/initialization control signal having an inactive level through the read-out/initialization control line.

5. The display apparatus of claim 1, wherein the scan driver is configured to, in an emission period, output a scan signal having an inactive level through the scan line, output a first emission control signal having an active level through the first emission control line, output a second emission control signal having an active level through the second emission control line, and output a read-out/initialization control signal having an inactive level through the read-out/initialization control line.

6. The display apparatus of claim 1, wherein the scan driver is configured to, in a first read-out period, output a scan signal having an inactive level through the scan line, output a first emission control signal having an active level through the first emission control line, output a second emission control signal having an inactive level through the second emission control line, and output a read-out/initialization control signal having an active level through the read-out/initialization control line, and the read-out circuit is configured to, in the first read-out period, generate data corresponding to a driving current, based on a signal received through the read-out line.

7. The display apparatus of claim 6, wherein the scan driver is configured to, in a second read-out period, output the scan signal having an active level through the scan line, output the first emission control signal having an inactive level through the first emission control line, output the second emission control signal having an inactive level through the second emission control line, and output the read-out/initialization control signal having an active level through the read-out/initialization control line, and the read-out circuit is configured to, in the second read-out period, generate data corresponding to a threshold voltage, based on the signal received through the read-out line.

8. The display apparatus of claim 7, wherein the scan driver is configured to, in a third read-out period, output the scan signal having an inactive level through the scan line, output the first emission control signal having an active level through the first emission control line, output the second emission control signal having an active level through the second emission control line, and output the read-out/initialization control signal having an active level through the read-out/initialization control line, and the read-out circuit is configured to, in the third read-out period, generate data corresponding to a forward voltage, based on the signal received through the read-out line.

9. The display apparatus of claim 1, wherein brightness of the organic light-emitting diode is controlled by a voltage of the data line.

10. The display apparatus of claim 1, wherein the scan driver is configured to, in an emission period, output a scan signal having an inactive level through the scan line, output a first emission control signal having an active level through the first emission control line, and output a read-out/initialization control signal having an inactive level through the read-out/initialization control line, and the scan driver is configured to output a second emission control signal having an active level through the second emission control line in a first period of the emission period and output the second emission control signal having an inactive level through the second emission control line in a second period of the emission period.

11. The display apparatus of claim 1, wherein a size of the second transistor is less than a size of the third transistor.

12. The display apparatus of claim 1, wherein, in a reset period, a voltage of an initialization power source is applied to each of the plurality of pixels through the read-out line, and in a first read-out period, a second read-out period, and a third read-out period, each of the plurality of pixels is configured to output a read-out signal through the read-out line.

13. The display apparatus of claim 1, further comprising a first switch and a second switch, wherein the first switch is connected between the read-out line and an initialization power node to which an initialization voltage is supplied and the second switch is connected between the read-out line and the read-out circuit, in a reset period, the first switch is turned on and the second switch is turned off, and in a read-out period, the first switch is turned off and the second switch is turned on.

14. A display apparatus comprising:
a display panel including a plurality of pixels; and
a display driving circuit including a scan driver, a data driver, and a read-out circuit,
wherein each of the plurality of pixels comprises:
a first transistor connected between a first node and a third node and configured to operate based on a voltage of a second node;

a second transistor connected between the first node and a data line and configured to operate based on a scan signal received through a scan line;

a third transistor connected between the second node and the third node and configured to operate based on the scan signal;

a fourth transistor connected between a first driving power source and the first node and configured to operate based on a first emission control signal received through a first emission control line;

a fifth transistor connected between the third node and an organic light-emitting diode and configured to operate based on a second emission control signal received through a second emission control line;

a sixth transistor connected between a read-out line and the second node and configured to operate based on a read-out/initialization control signal received through a read-out/initialization control line;

a capacitor connected between the first node and the second node; and the organic light-emitting diode connected between the fifth transistor and a second driving power source, the scan driver is connected with the plurality of pixels through the scan line, the first emission control line, the second emission control line, and the read-out/initialization control line, the data driver is connected with the plurality of pixels through the data line and is configured to supply a data voltage corresponding to a luminance through the data line, and the read-out circuit is connected with the plurality of pixels through the read-out line and is configured to read out an electrical characteristic of each of the plurality of pixels through the read-out line.

15. The display apparatus of claim 14, wherein the scan driver is configured to, in a reset period, output the scan signal having an inactive level through the scan line, output the first emission control signal having an active level through the first emission control line, output the second emission control signal having an inactive level through the second emission control line, and output the read-out/initialization control signal having an active level through the read-out/initialization control line.

16. The display apparatus of claim 14, wherein the scan driver is configured to, in a program period, output the scan signal having an active level through the scan line, output the first emission control signal having an inactive level through the first emission control line, output the second emission control signal having an inactive level through the second emission control line, and output the read-out/initialization control signal having an inactive level through the read-out/initialization control line.

17. The display apparatus of claim 14, wherein the scan driver is configured to, in a hold period, output the scan signal having an inactive level through the scan line, output the first emission control signal having an inactive level through the first emission control line, output the second emission control signal having an inactive level through the second emission control line, and output the read-out/initialization control signal having an inactive level through the read-out/initialization control line.

18. The display apparatus of claim 14, wherein the scan driver is configured to, in an emission period, output the scan signal having an inactive level through the scan line, output the first emission control signal having an active level through the first emission control line, output the second emission control signal having an active level through the second emission control line, and output the read-out/initialization control signal having an inactive level through the read-out/initialization control line.

19. The display apparatus of claim 14, wherein the scan driver is configured to, in a read-out period, output the scan signal having an active level through the scan line, output the first emission control signal having an inactive level through the first emission control line, output the second emission control signal having an inactive level through the second emission control line, and output the read-out/initialization control signal having an active level through the read-out/initialization control line, and the read-out circuit is configured to, in the read-out period, generate data corresponding to a threshold voltage, based on a signal received through the read-out line.

20. A display panel including a plurality of pixels, each of the plurality of pixels comprising:

a scan line extending in a first direction;

a first emission control line extending in the first direction;

a second emission control line extending in the first direction;

a read-out/initialization control line extending in the first direction;

a data line extending in a second direction intersecting with the first direction;

a read-out line extending in the second direction;

a first transistor connected between a first node and a third node and configured to operate based on a voltage of a second node;

a second transistor connected between the first node and the data line and configured to operate based on a scan signal received through the scan line;

a third transistor connected between the second node and the third node and configured to operate based on the scan signal;

a fourth transistor connected between a first driving power source and the first node and configured to operate based on a first emission control signal received through the first emission control line;

a fifth transistor connected between the third node and an organic light-emitting diode and configured to operate based on a second emission control signal received through the second emission control line;

a sixth transistor connected between the read-out line and the third node and configured to operate based on a read-out/initialization control signal received through the read-out/initialization control line;

a capacitor connected between the first node and the second node; and the organic light-emitting diode connected between the fifth transistor and a second driving power source.

* * * * *